United States Patent
Ueno

(10) Patent No.: US 10,444,300 B2
(45) Date of Patent: Oct. 15, 2019

(54) MAGNETIC FIELD MEASURING DEVICE AND METHOD FOR MANUFACTURING MAGNETIC FIELD MEASURING DEVICE

(71) Applicant: SEIKO EPSON CORPORATION, Tokyo (JP)

(72) Inventor: Hitoshi Ueno, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 318 days.

(21) Appl. No.: 15/616,095

(22) Filed: Jun. 7, 2017

(65) Prior Publication Data

US 2017/0363695 A1 Dec. 21, 2017

(30) Foreign Application Priority Data

Jun. 21, 2016 (JP) .................................. 2016-122368

(51) Int. Cl.
*G01R 33/032* (2006.01)
*G01R 33/24* (2006.01)
*G01R 33/26* (2006.01)

(52) U.S. Cl.
CPC ......... *G01R 33/032* (2013.01); *G01R 33/243* (2013.01); *G01R 33/26* (2013.01)

(58) Field of Classification Search
CPC ..... G01R 33/032; G01R 33/243; G01R 33/26
See application file for complete search history.

(56) References Cited

U.S. PATENT DOCUMENTS

| 8,405,389 B2 | 3/2013 | Sugioka et al. |
| 10,036,786 B2* | 7/2018 | Ueno ................... G01R 33/032 |
| 10,254,356 B2* | 4/2019 | Nagasaka .............. G01R 33/26 |

FOREIGN PATENT DOCUMENTS

| JP | 2009-162554 A | | 7/2009 |
| JP | 2012154875 A | * | 8/2012 |
| JP | 2013-108833 A | | 6/2013 |
| JP | 2015-102492 A | | 6/2015 |

* cited by examiner

*Primary Examiner* — Seung H Lee
(74) *Attorney, Agent, or Firm* — Oliff PLC

(57) ABSTRACT

A magnetic field measuring device includes: a first cell and a second cell in which alkali metal atoms are entrapped and which are disposed in this order in a sensing direction of a magnetic field; a first reflective mirror, a second reflective mirror, and an autocollimator as an optical axis detector. Beam light as second polarized light and beam light as fourth polarized light, which are detected by the autocollimator, have orientations of optical axes in the same direction.

9 Claims, 11 Drawing Sheets

MAGNETIC FIELD MEASURING DEVICE AND METHOD FOR MANUFACTURING MAGNETIC FIELD MEASURING DEVICE

BACKGROUND

1. Technical Field

The present invention relates to a magnetic field measuring device and a method for manufacturing a magnetic field measuring device.

2. Related Art

As a magnetic field measuring device, a sensitive atom-based magnetic sensor using spin of atoms in an alkali metal gas or a rare gas is proposed.

For example, JP-A-2009-162554 discloses an atom-based magnetic sensor that includes a light source for probe light and a medium which propagates probe light, in which the medium has a first measurement position and a second measurement position, and differences in magnetic field intensity between the first measurement position and the second measurement position are directly measured as differences between polarization rotating angles of the probe light along a propagation route of the probe light.

In JP-A-2009-162554 above, an example in which the first measurement position and the second measurement position are set in the same cell, and an example in which the positions are set on separate cells are described.

In addition, JP-A-2015-102492 discloses a magnetic field measuring device that includes a light source, a cell in which a gas is contained, a polarization splitter that splits light emitted from the light source into a polarized light component in a first axial direction and a polarized light component in a second axial direction, a light intensity measuring unit that measures light intensity of the polarized light component in the second axial direction, and a magnetic field measuring unit that measures a magnetic field from the light intensity in the first axial direction, which is transmitted through the cell, based on measurement results of the light intensity by the light intensity measuring unit.

In JP-A-2015-102492, an example of a multichannel method in which the polarized light component in the first axial direction is incident to a plurality of cells is described.

In the atom-based magnetic sensor disclosed in JP-A-2009-162554, a traveling direction of the probe light is reversed after the probe light is transmitted through the first measurement position, and then the probe light is caused to be incident to and to be transmitted through the second measurement position. In this manner, since there is no need to provide a plurality of light detectors in order to detect the polarization rotating angles of the probe light at the first measurement position and the second measurement position, respectively, it is possible to prevent noise from being mixed to measurement results of the magnetic field, based on characteristic differences of individual light detectors.

However, it is technically difficult to cause the probe light to be incident to the first measurement position and the second measurement position in determined directions, respectively. Further, in a case where the first measurement position and the second measurement position are set on separate cells, the probe light is required to be incident to individual cells in the determined directions with high accuracy.

Furthermore, if a technical idea of the atom-based magnetic sensor in JP-A-2009-162554 is applied to the magnetic field measuring device using the multichannel method as disclosed in JP-A-2015-102492, it is necessary to dispose the plurality of cells at the first measurement position and the second, measurement position, respectively, and thus a problem arises in that it is more difficult to adjust positions of the plurality of cells with respect to incident directions of the probe light.

SUMMARY

An advantage of some aspects of the invention is to solve at least a part of the problems described above, and the invention can be implemented as the following forms or application examples.

Application Example

A magnetic field measuring device according to this application example includes: a light irradiator that performs irradiation with linearly polarized light; a first cell and a second cell in which alkali metal atoms are entrapped and which are disposed in this order in a sensing direction of a magnetic field; a first light branching element that causes the linearly polarized light to branch into first polarized light which is incident to the first cell and second polarized light which is parallel to the first polarized light; and a second light branching element that causes the linearly polarized light to branch into third polarized light which is incident to the second cell and fourth polarized light which is parallel to the third polarized light. A position of the second cell is adjusted with respect to the first cell such that an orientation of an optical axis of the second polarized light and an orientation of an optical axis of the fourth polarized light are the same direction.

According to this application example, the first polarized light and the second polarized light, which are subjected to branching by the first light branching element, are parallel to each other, and the third polarized light and the fourth polarized light, which are subjected to branching by the second light branching element, are parallel to each other. Hence, the position of the second cell is adjusted with respect to the first cell such that the orientation of the optical axis of the second polarized light and the orientation of the optical axis of the fourth polarized light are the same direction, and thereby the linearly polarized light is incident to the first cell and the second cell in the same direction. Hence, it is possible to provide a gradiometer-type magnetic field measuring device that is capable of measuring a magnetic field generated from a magnetic field source with high accuracy, in which the optical axes of the linearly polarized light incident to the first cell and the second cell, respectively, have the same orientation and influences of external magnetic fields are appropriately excluded.

In the magnetic field measuring device according to the application example, the first light branching element may be provided with a first light branching unit that reflects the linearly polarized light, causes the light to be incident to the first cell, and converts the light into the first polarized light, and a first mirror that reflects the linearly polarized light transmitted through the first light branching unit and converts the light into the second polarized light. The second light branching element may be provided with a second light branching unit that reflects the linearly polarized light, causes the light to be incident to the second cell, and converts the light into the third polarized light, and a second mirror that reflects the linearly polarized light transmitted through the second light branching unit and converts the light into the fourth polarized light.

According to this configuration, the first light branching unit and the second light branching unit have functions of reflecting and transmitting the incident linearly polarized light, respectively. Hence, the linearly polarized light reflected from the first light branching unit is incident to the first cell as the first polarized light and the linearly polarized light transmitted through the first light branching unit is reflected from the first mirror so as to be converted into the second polarized light parallel to the first polarized light. Similarly, the linearly polarized light reflected from the second light branching unit is incident to the second cell as the third polarized light and the linearly polarized light transmitted through the second light branching unit is reflected from the second mirror so as to be converted into the fourth polarized light parallel to the third polarized light.

The magnetic field measuring device according to the application example may further include: an optical axis detector that is capable of detecting the orientation of the optical axis of the second polarized light and the orientation of the optical axis of the fourth polarized light.

According to this configuration, the optical axis detector is provided, and thereby it is possible to provide the gradiometer-type magnetic field measuring device that is capable of verifying whether or not an orientation of an optical axis of the first polarized light as the linearly polarized light incident to the first cell and an orientation of an optical axis of the third polarized light as the same linearly polarized light incident to the second cell are the same direction.

The magnetic field measuring device according to the application example may further include: a third cell disposed in a direction orthogonal to the sensing direction with respect to the first cell; and a fourth cell disposed in a direction orthogonal to the sensing direction with respect to the second cell.

According to this configuration, it is possible to provide a gradiometer-type or multichannel-type magnetic field measuring device that is capable of measuring the magnetic field generated from the magnetic field source with high accuracy, with the influences of external magnetic fields appropriately excluded.

In the magnetic field measuring device according to the application example, the light irradiator may be provided with a first light irradiator that irradiates the first cell and the third cell with the linearly polarized light and a second light irradiator that irradiates the second cell and the fourth cell with the linearly polarized light.

According to this configuration, it is possible to cause the linearly polarized light to be incident to the cells with equal intensity while light intensity of the linearly polarized light emitted from the first light irradiator and the second light irradiator, respectively, is suppressed, compared to a case where one light irradiator irradiates, with the linearly polarized light, the cells disposed in a gradiometer type and a multichannel type.

The magnetic field measuring device according to the application example may further include: a first reference surface on which the first light branching element is disposed; and a second reference surface on which the second light branching element is disposed. A position of the second reference surface may be adjustable with respect to the first reference surface.

According to this configuration, the first light branching element and the first cell are disposed on the first reference surface, and the second light branching element and the second cell are disposed on the second reference surface. Hence, a reference surface for adjustment is provided, the position of the second reference surface is adjusted with respect to the first reference surface, and thereby it is possible to easily adjust the orientation of the optical axis of the second polarized light and the orientation of the optical axis of the fourth polarized light such that the second polarized light and the fourth polarized light have the same orientation, compared to a case where the position of the second cell is individually adjusted with respect to the first cell.

In the magnetic field measuring device according to the application example, the sensing direction of the magnetic field may intersect with an incident direction of the linearly polarized light in the first cell and the second cell.

According to this configuration, since it is not always necessary to dispose the magnetic field sources (measurement targets) in the incident directions of the linearly polarized light incident to the cells, it is possible to provide the gradiometer-type magnetic field measuring device that has high flexibility in the disposition of the magnetic field sources.

Application Example

A method for manufacturing a magnetic field measuring device according to this application example is a method for manufacturing a magnetic field measuring device that includes a light irradiator that performs irradiation with linearly polarized light, a first cell and a second cell in which alkali metal atoms are entrapped, a first light branching element that causes the linearly polarized light to branch into first polarized light which is incident to the first cell and second polarized light which is parallel to the first polarized light, and a second light branching element that causes the linearly polarized light to branch into third polarized light which is incident to the second cell and fourth polarized light which is parallel to the third polarized light, the method including: disposing the first cell and the second cell in this order in a sensing direction of a magnetic field; detecting an orientation of an optical axis of the second, polarized light and an orientation of an optical axis of the fourth polarized light; and adjusting a position of the second cell with respect to the first cell such that the orientation of the optical axis of the second polarized light and the orientation of the optical axis of the fourth polarized light are the same direction, based on the result of the detecting of the optical axis.

According to this application example, in the adjusting of the position, the position of the second cell is adjusted with respect to the first cell, based on the result of the detecting of the optical axis, such that the orientation of the optical axis of the second polarized light and the orientation of the optical axis of the fourth polarized light are the same direction. The second polarized light is parallel to the first polarized light, and the fourth polarized light is parallel to the third polarized light. Therefore, this means that the linearly polarized light is incident to the first cell and the second cell in the same direction. Hence, it is possible to provide the method for manufacturing a gradiometer-type magnetic field measuring device that is capable of measuring the magnetic field generated from the magnetic field source with high accuracy in which the first cell and the second cell are disposed in the sensing direction of the magnetic field, in a state in which the optical axes of the linearly polarized light incident to the first cell and the second cell, respectively, have the same orientation and influences of external magnetic fields are appropriately excluded.

In the method for manufacturing a magnetic field measuring device according to the application example, the detecting of the optical axis may include, detecting the orientation of the optical axis of the second polarized light, and detecting the orientation of the optical axis of the fourth polarized light. The detecting the orientation of the optical axis of the fourth polarized light may be performed after the disposing the first and second cells, and the orientation of the optical axis of the fourth polarized light is detected with the detected orientation of the optical axis of the second polarized light as a reference.

According to this method, since the orientation of the optical axis of the fourth polarized light is detected with the orientation of the optical axis of the second polarized light as a reference, it is possible to easily adjust the position of the second cell with respect to the first cell.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the figures. Note that the figures used are shown by being appropriately enlarged or reduced in size such that parts, which are described, are shown in a recognizable state.

Hereinafter, the embodiments will be described, as an example, with an optical pumping type of magnetic field measuring device that is capable of measuring a small magnetic field which is generated by a heart or a brain of a biological body as a magnetic field source of a measurement target. In addition, the magnetic field measuring device is a device with introduction of disposition of gradiometer-type magnetic sensors that excludes influences of external magnetic fields in measurement of a magnetic field by using a difference in magnitude of a magnetic field gradient due to a distance between a magnetic field source and a magnetic sensor.

First Embodiment

Magnetic Field Measuring Device

Figure 1:
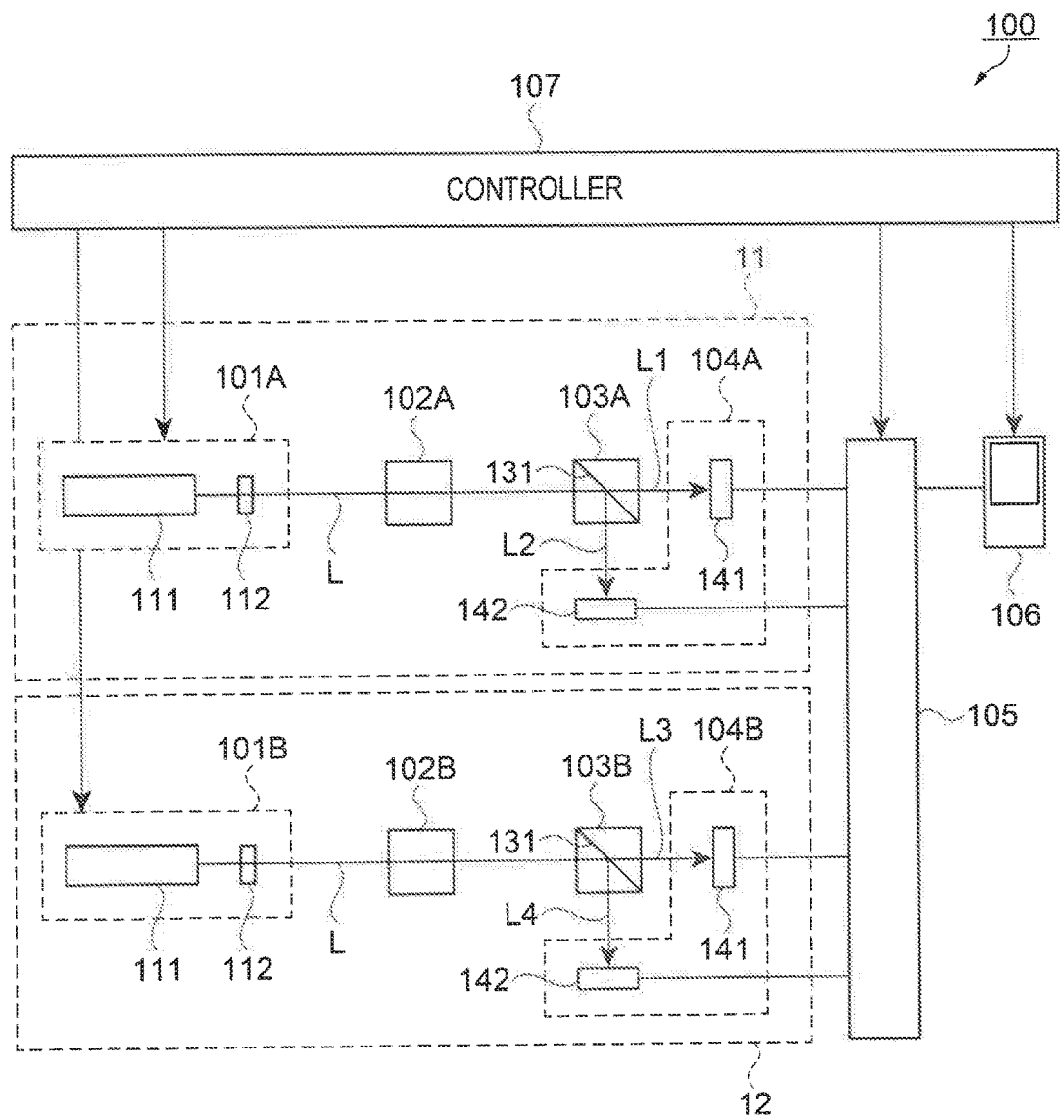
FIG. 1 is a block diagram illustrating a configuration of a magnetic field measuring device of a first embodiment.

The magnetic field measuring device of the embodiment is described with reference to FIG. 1. FIG. 1 is a block diagram illustrating a configuration of the magnetic field measuring device of the first embodiment.

As illustrated in FIG. 1, a magnetic field measuring device 100 of the embodiment includes a measuring magnetic sensor 11, a reference magnetic sensor 12, a signal processing unit 105, a display unit 106, and a controller 107 that collectively controls the sensors and the units. The measuring magnetic sensor 11 is configured to include a first light irradiator 101A, a first cell 102A, a first polarization splitter 103A, and a first light receiving unit 104A. The reference magnetic sensor 12 is configured to include a second light irradiator 101B, a second cell 102B, a second polarization splitter 103B, and a second light receiving unit 104B.

The magnetic field measuring device 100 irradiates and excites gaseous alkali metal atoms entrapped in a cell with pump light and irradiates, with probe light as linearly polarized light, alkali metal atoms having spin polarization produced due to the excitation. The spin polarization of the alkali metal atom receives an influence of the magnetic field and alignment orientation thereof changes. Since the probe light, with which the irradiation is performed, receives an influence of the alignment orientation of the spin polarization and a rotating angle of a polarization plane changes, the rotating angle of the polarization plane is electrically detected, and thereby a magnitude (intensity) of the magnetic field is measured. The first light irradiator 101A and the second light irradiator 101B are configured to emit beams of laser light L that serves as the pump light and the probe light, respectively. In other words, the magnetic field measuring device 100 of the embodiment includes light pumping type and single beam type of two magnetic sensors.

Since the two magnetic sensors basically have the same configuration, configurations of the measuring magnetic sensor 11 are described, and the detailed description of the reference magnetic sensor 12 is omitted. Hence, in the description, the first light irradiator 101A and the second light irradiator 101B are collectively referred to as a light irradiator 101, and the first cell 102A and the second cell 102B are collectively referred to as a cell 102. In addition, the first polarization splitter 103A and the second polarization splitter 103B are collectively referred to as a polarization splitter 103, and the first light receiving unit 104A and the second light receiving unit 104B are collectively referred to as a light receiving unit 104.

The light irradiator 101 is provided with a light source 111 and a conversion unit 112. The light source 111 is a device that generates the laser light L, and, for example, is provided with a laser diode and a drive circuit thereof. A frequency of the laser light L is set to a frequency corresponding to transition of ultrastructure level of the alkali metal atoms entrapped in the cell 102. The conversion unit 112 converts an optical vibration direction of the laser light L emitted from the light source 111 into a predetermined direction. In other words, the conversion unit 112 is, for example, a polarizer and causes the laser light L to be emitted from the light irradiator 101 with an angle of the polarization plane of the laser light L as a predetermined angle. The cell 102 is irradiated with the laser light L emitted from the light irradiator 101 via a light guiding member such as an optical fiber (not illustrated) The cell 102 may be directly irradiated with the laser light L from the light irradiator 101 without the light guiding member; however, when the light guiding member is used, it is unlikely to have restrictions on a size or disposition of the light irradiator 101.

For example, alkali metal atoms such as potassium (K) or cesium (Cs) are entrapped inside the cell 102. In the embodiment, cesium (Cs) is entrapped. The cell 102 is formed by using a material, such as quartz glass or borosilicate glass, which has optical transparency, does not react with alkali metal that is entrapped, and does not transmit the alkali metal atoms. Note that the material of the cell is not limited to the glass, and may be a resin as long as the material satisfies the conditions described above.

The laser light L transmitted through the cell 102 is incident to the polarization splitter 103. Note that the laser light L transmitted through the cell 102 may be guided to the polarization splitter 103 via a light guiding member.

For example, a polarization beam splitter formed of two joined right angle prisms is used as the polarization splitter 103. For example, a dielectric multilayer film having different refractive index is formed on a prism interface 131 as a joining surface of the two right angle prisms. The polarization splitter 103 is disposed such that the laser light L as the linearly polarized light transmitted through the cell 102 is incident to the prism interface 131. The laser light L incident to the prism interface 131 is split into polarized light L1 (polarized light L3) having a first polarization plane (vibration plane of the linearly polarized light) which is parallel to an incident plane of the prism interface 131 due to the dielectric multilayer film, and polarized light L2 (polarized light L4) having a second polarization plane which is orthogonal to the first polarization plane. The polarized light L1 (polarized light L3) is transmitted through the polarization splitter 103 and is incident to one light receiving element 141 provided in the light receiving unit 104. The polarized light L2 (polarized light L4) is reflected from the prism interface 131 (dielectric multilayer film) and is incident to the other light receiving element 142 provided in the light receiving unit 104. The incident plane of the prism interface 131 is a plane containing the normal line of the prism interface 131, and an optical axis of the laser light L incident to the prism interface 131.

The conversion unit 112 converts the polarization plane of the laser light L as the linearly polarized light into a plane parallel to the incident plane of the prism interface 131. In other words, the polarization splitter 103 is disposed on the optical axis of the laser light L between the cell 102 and the light receiving unit 104 such that an orientation of the incident plane of the prism interface 131 is the same as an orientation of the polarization plane of the laser light L which is converted by the conversion unit 112. In this manner, when there is no magnetic field in the cell 102 (when no magnetic field is applied to the cell 102), an angle of the polarization plane of the laser light L transmitted through the cell 102 does not change. Therefore, the laser light L incident to the polarization splitter 103 is split into the polarized light L1 (polarized light L3) and the polarized light L2 (polarized light L4) which have equal levels of intensity, respectively. When a magnetic field is applied to the cell 102, the angle (orientation) of the polarization plane of the laser light L changes with reception of an influence of the magnetic field. Thus, differences in intensities of the polarized light L1 (polarized light L3) and the polarized light L2 (polarized light L4) split by the polarization splitter 103 are produced. In other words, it is possible to obtain the rotating angle of the polarization plane of the laser light L, that is, magnitudes (intensities) of magnetic fields applied to the two magnetic sensors, respectively, from the differences in intensities of the polarized light L1 (polarized light L3) and the polarized light L2 (polarized light L4).

The light receiving unit 104 is provided with the light receiving element 141 and the light receiving element 142 which have sensitivity to a wavelength of the laser light L. An example of the light receiving elements 141 and 142 can include a photodiode or the like. As described above, the light receiving element 141 receives the polarized light L1 (polarized light L3) and outputs a signal corresponding to received light intensity to the signal processing unit 105. The light receiving element 142 receives the polarized light L2 (polarized light L4) and outputs a signal corresponding to the received light intensity to the signal processing unit 105.

The polarization splitter 103 and the light receiving unit 104 in the embodiment are an example of a rotating angle detector that detects the rotating angle of the polarization plane of the probe light.

The signal processing unit 105 calculates the magnitude (intensity) of the magnetic field in a measurement axis (in the embodiment, a direction along the optical axis of the laser light L). As described above, an amount of change in the rotating angle between the polarization planes of the laser light L measured before and after the transmission through the cell 102 depends on the magnitude (intensity) of the magnetic field applied to the cell 102. First, the signal processing unit 105 computes the rotating angle between the polarization planes by using the signals from the light receiving element 141 and the light receiving element 142, and then computes the magnitude (intensity) of the magnetic field from the rotating angle. Specifically, a difference between photocurrents of the polarized light L1 (polarized light L3) and the polarized light L2 (polarized light L4) is obtained, and the magnitude (intensity) of the magnetic field is obtained from the difference.

In addition, according to such a method of obtaining the difference between the photocurrents of the polarized light L1 (polarized light L3) and the polarized light L2 (polarized light L4), it is possible to obtain the orientation of the magnetic field. For example, the difference of the photocurrents is a value obtained by subtracting the photocurrent of the polarized light L2 (polarized light L4) from the polarized light L1 (polarized light L3) and a sign of the difference is considered. Here, when there is a magnetic field in a direction in which the laser light L is transmitted through the cell 102, a polarization plane of the laser light L rotates after the transmission through the cell 102 and the polarization splitter 103 is disposed such that the photocurrent of the polarized light L1 (polarized light L3) increases and the photocurrent of the polarized light L2 (polarized light L4) decreases, the sign of the difference is plus (+). When there is a magnetic field having an orientation opposite to the direction in which the laser light L is transmitted through the cell 102 in an installed state of the polarization splitter 103, a polarization plane of the laser light L rotates in a direction opposite to the previous rotating direction after the transmission through the cell 102, the photocurrent of the polarized light L1 (polarized light L3) decreases, the photocurrent of the polarized light L2 (polarized light L4) increases, and the sign of the difference is minus (−). As described above, the orientation of the magnetic field is found from the sign of the difference. Whether the sign is either the plus (+) or the minus (−), an absolute value of the difference is the magnitude (intensity) of the magnetic field.

For example, the display unit 106 is a display device such as a liquid crystal display, and displays information indicating the magnitude (intensity), the orientation, or the like of the magnetic field which is computed by the signal processing unit 105.

The controller 107 electrically controls the components of the magnetic field measuring device 100. The controller 107 includes a processing unit such as a CPU and a memory. Although not illustrated, the magnetic field measuring device 100 may include an input device such as a keyboard or a touch screen.

In the embodiment, the two magnetic sensors are configured to include the light irradiators 101, respectively; however, the configuration is not limited thereto, and a configuration in which the laser light L emitted from one light irradiator 101 is guided to the first cell 102A and the second cell 102B may be employed. In other words, the magnetic sensor may be used as a sensor that does not include the light irradiator 101.

Principle of Magnetic Field Measuring Method

Figure 2:
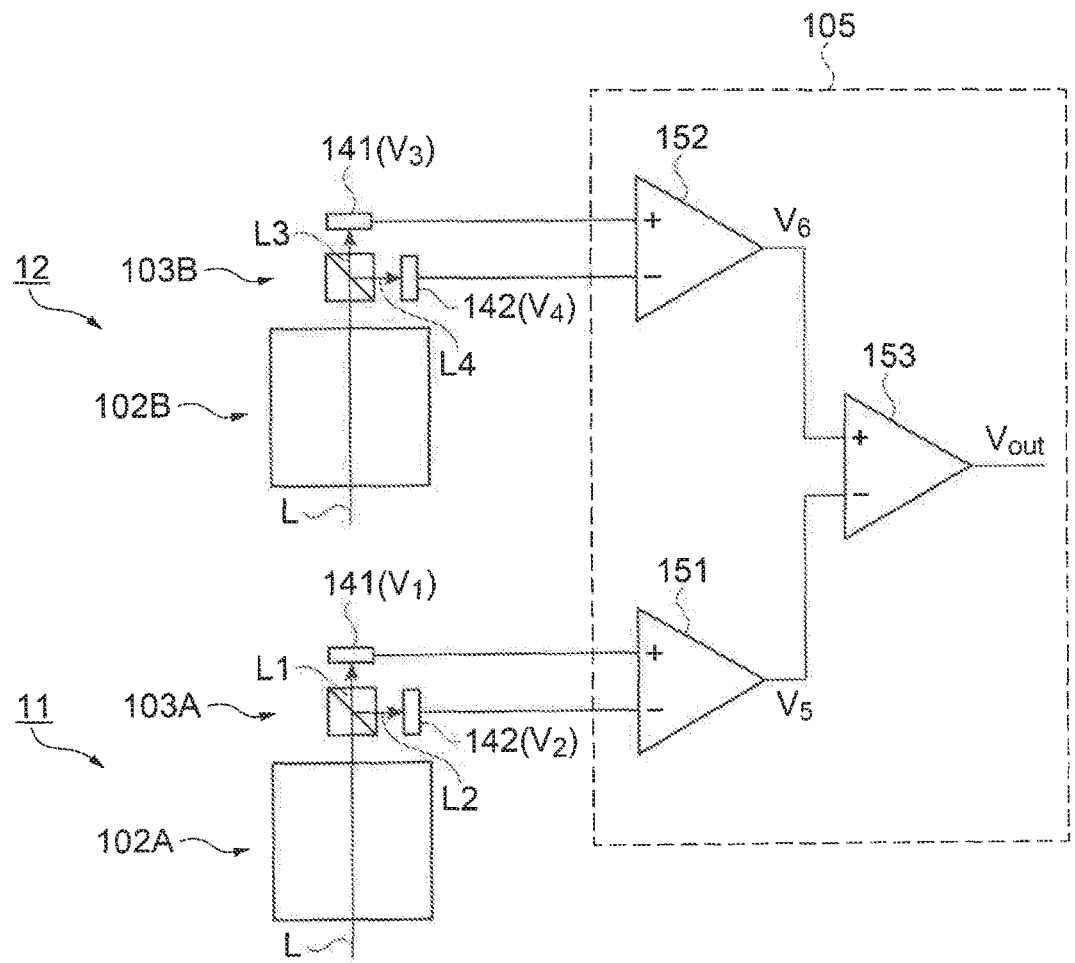
FIG. 2 is a schematic diagram illustrating disposition of two magnetic sensors.
Figure 3:
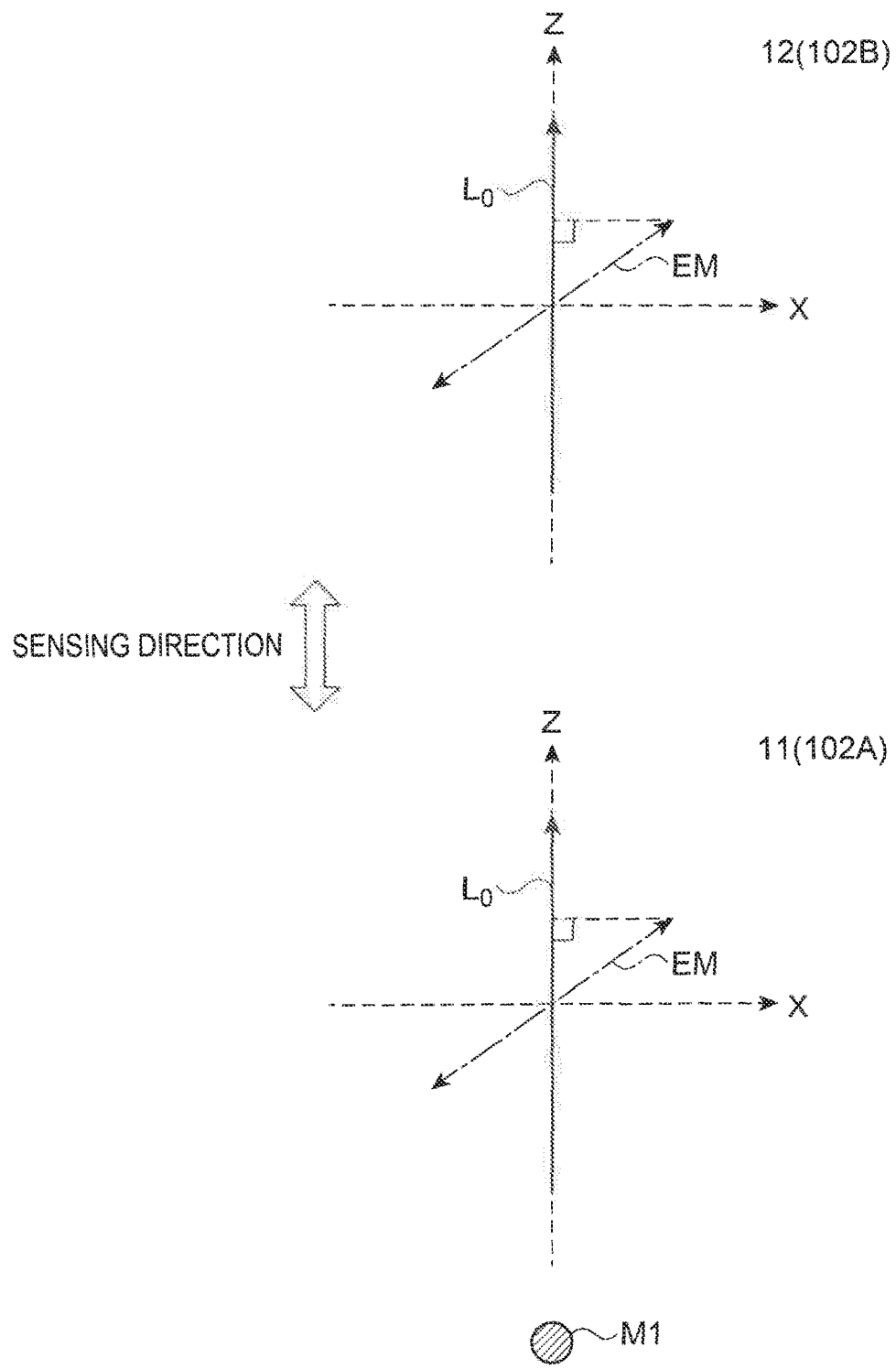
FIG. 3 is a diagram illustrating a relationship between a laser optical axis and an external magnetic field in the two magnetic sensors.
Figure 4:
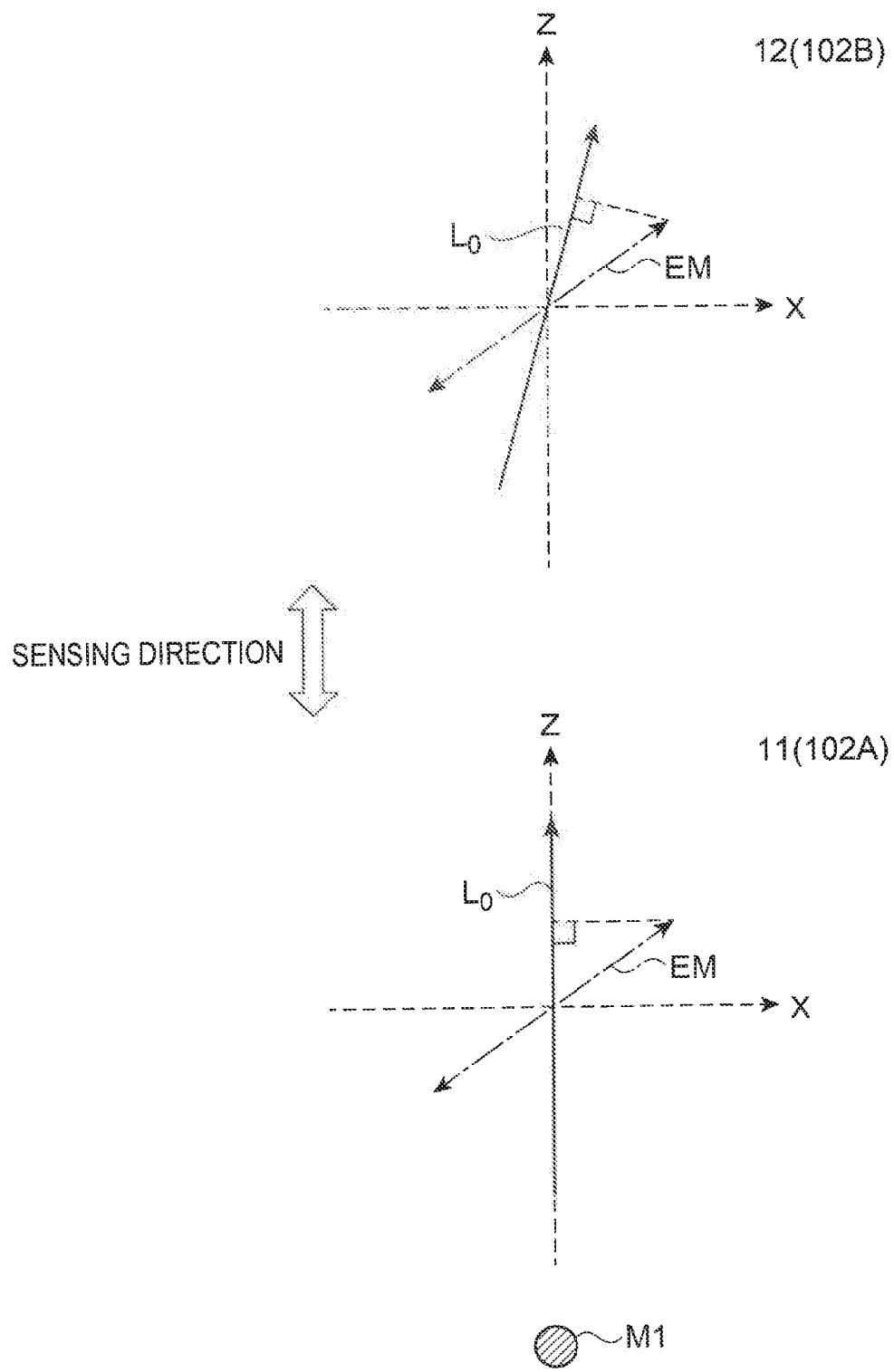
FIG. 4 is a diagram illustrating a relationship between another laser optical axis and another external magnetic field in the two magnetic sensors.

Next, a principle of a magnetic field measuring method using the magnetic field measuring device 100 will be described with reference to FIGS. 2 to 4. FIG. 2 is a schematic diagram illustrating disposition of the two magnetic sensors, FIGS. 3 and 4 are diagrams illustrating relationships between laser optical axes and external magnetic fields in the two magnetic sensors. Hereinafter, the measuring magnetic sensor 11 and the reference magnetic sensor 12 are referred to as two magnetic sensors 11 and 12 in some cases.

The disposition of the two magnetic sensors 11 and 12 is described by using orthogonal coordinates of an X axis, a Y axis, and a Z axis which are orthogonal to each other, as illustrated in FIG. 2. For example, in the two magnetic sensors 11 and 12, the first cell 102A is disposed on a side close to a magnetic field source M1, and the second cell 102B is disposed on a side farther apart from the magnetic field source M1 than the first cell 102A in a Z-axial direction. A direction in which the two magnetic sensors 11 and 12 are disposed with respect to the magnetic field source M1 is not limited to the Z-axial direction.

The laser light L is incident to both of the first cell 102A and the second cell 102B in the Z-axial direction. As described above, the laser light L transmitted through the first cell 102A branches into the polarized light L1 and the polarized light L2 by the first polarization splitter 103A, the polarized light L1 is incident to the light receiving element 141, and the polarized light L2 is incident to the light receiving element 142. The laser light L transmitted through the second cell 102B branches into the polarized light L3 and the polarized light L4 by the second polarization splitter 103B, the polarized light L3 is incident to the light receiving element 141, and the polarized light L4 is incident to the light receiving element 142.

As illustrated in FIG. 3, since the magnetic field source M1, the first cell 102A, and the second cell 102B are disposed in this order in the Z-axial direction, and a laser optical axis $L_0$ of the laser light L is also parallel to the Z-axial direction, the sensing direction in the magnetic field measuring device 100 of the embodiment is a direction parallel to the Z-axial direction as shown by an arrow. In other words, the magnetic field source M1, the first cell 102A, and the second cell 102B are disposed in this order in the sensing direction.

The magnitude of the magnetic field of the magnetic field source M1 measured by the two magnetic sensors 11 and 12 is known to be inversely proportional to the square of a distance from the magnetic field source M1 to each of the magnetic sensors (Biot-Savart law). Hence, the magnitude of the magnetic field of the magnetic field source M1 which is measured by the measuring magnetic sensor 11 is larger than the magnitude of the magnetic field of the magnetic field source M1 which is measured by the reference magnetic sensor 12 disposed at a position farther apart from the magnetic field source M1 than the measuring magnetic sensor 11. In other words, the magnitude of the magnetic field of the magnetic field source M1 which is measured by the reference magnetic sensor 12 is smaller than the magnitude of the magnetic field of the magnetic field source M1 which is measured by the measuring magnetic sensor 11 disposed at a position closer to the magnetic field source M1 than the reference magnetic sensor 12.

On the other hand, as illustrated in FIG. 3, an external magnetic field EM including an ambient magnetic field of geomagnetism or the like shifts in an inclined direction intersecting with the X axis and the Z axis in a coordinate represented by the X axis and the Z axis. An external magnetic fields EM having the same magnitude in the same direction are applied to the two magnetic sensors 11 and 12 disposed at different positions in the Z-axial direction, respectively.

Compared to a magnitude of the external magnetic field EM at a level of nanotesla (nT) in general, for example, the magnetic field source M1 such as a heart or a brain in a biological body generates a magnitude of a magnetic field at a level of picotesla (pT). Hence, measurement of the magnetic field of the magnetic field source M1 is influenced (has noise) by the external magnetic field EM having a magnitude larger than the magnitude of the magnetic field of the magnetic field source M1.

The magnetic field measuring device 100 of the embodiment uses a magnetic field measuring method in which it is possible to exclude an influence (noise) of the external magnetic field EM. Specifically, as illustrated in FIG. 2, in the measuring magnetic sensor 11, the light receiving element 141 receives the polarized light L1 and outputs a potential $V_1$, and the light receiving element 142 receives the polarized light L2 and outputs a potential $V_2$. Also, in the reference magnetic sensor 12, the light receiving element 141 receives the polarized light L3 and outputs a potential $V_3$, and the light receiving element 142 receives the polarized light L4 and outputs a potential $V_4$.

For example, the signal processing unit 105 is provided with three operational amplifiers 151, 152, and 153. The operational amplifier 151 performs an operation of a difference between the potential $V_1$ and the potential $V_2$ and outputs a potential $V_5$. The operational amplifier 152 performs an operation of a difference between the potential $V_3$ and the potential $V_4$ and outputs a potential $V_6$. The operational amplifier 153 performs an operation of a difference between the potential $V_5$ and the potential $V_6$ and outputs a potential $V_{out}$.

The potential $V_5$ electrically represents the magnitude of the magnetic field of the magnetic field source M1 that is detected by the measuring magnetic sensor 11 and includes the noise of the external magnetic field EM. The potential $V_6$ electrically represents the magnitude of the magnetic field of the magnetic field source M1 that is detected by the reference magnetic sensor 12 and includes the noise of the external magnetic field EM. As illustrated in FIG. 3, the external magnetic fields EM having the same magnitude are applied to the two magnetic sensors 11 and 12 in the same direction, and a difference between the potential $V_5$ and the potential $V_6$ is operated. In this manner, it is possible to exclude the noise of the external magnetic field EM. In addition, since the magnetic field generated from the magnetic field source M1 is inversely proportional to the square of the distance between the magnetic field source M1 and the magnetic sensor, the magnitude of the magnetic field of the magnetic field source M1, which is detected by the reference magnetic sensor 12, is significantly smaller than the magnitude of the magnetic field of the magnetic field source M1, which is detected by the measuring magnetic sensor 11. Therefore, it is possible to consider the magnitude of the magnetic field of the magnetic field source M1, which is detected by the reference magnetic sensor 12, to be "zero". Hence, the difference between the potential $V_5$ and the potential $V_6$ is operated. In this manner, it is possible to exclude the noise of the external magnetic field EM, and it is possible to electrically retrieve, as the potential $V_{out}$, the magnitude of the magnetic field of the magnetic field source M1, which is detected by the measuring magnetic sensor 11.

Incidentally, as illustrated in FIG. 4, in a case where the incident direction of the laser light L to the second cell 102B of the reference magnetic sensor 12, that is, the direction of the laser optical axis $L_0$, shifts from the Z-axial direction, the magnitude of the noise of the external magnetic field EM, which is detected by the reference magnetic sensor 12, is different from the magnitude of the noise of the external magnetic field EM, which is detected by the measuring magnetic sensor 11, from the relationship with the rotating angles of the polarization planes of the laser light L. Hence, even when the difference between the potential $V_5$ and the potential $V_6$ is operated, it is not possible to appropriately exclude the noise of the external magnetic field EM. Such a problem can arise similarly to a case where the direction of the laser optical axis $L_0$ in the first cell 102A of the measuring magnetic sensor 11 shifts from the Z-axial direction. In other words, the incident directions (orientations of the laser optical axes $L_0$) of the laser light L to the first cell 102A and the second cell 102B are obtained to be the same. The magnetic field measuring device 100 of the embodiment has a configuration of being capable of excluding such a problem described above, and is described with reference to FIG. 5.

Figure 5:
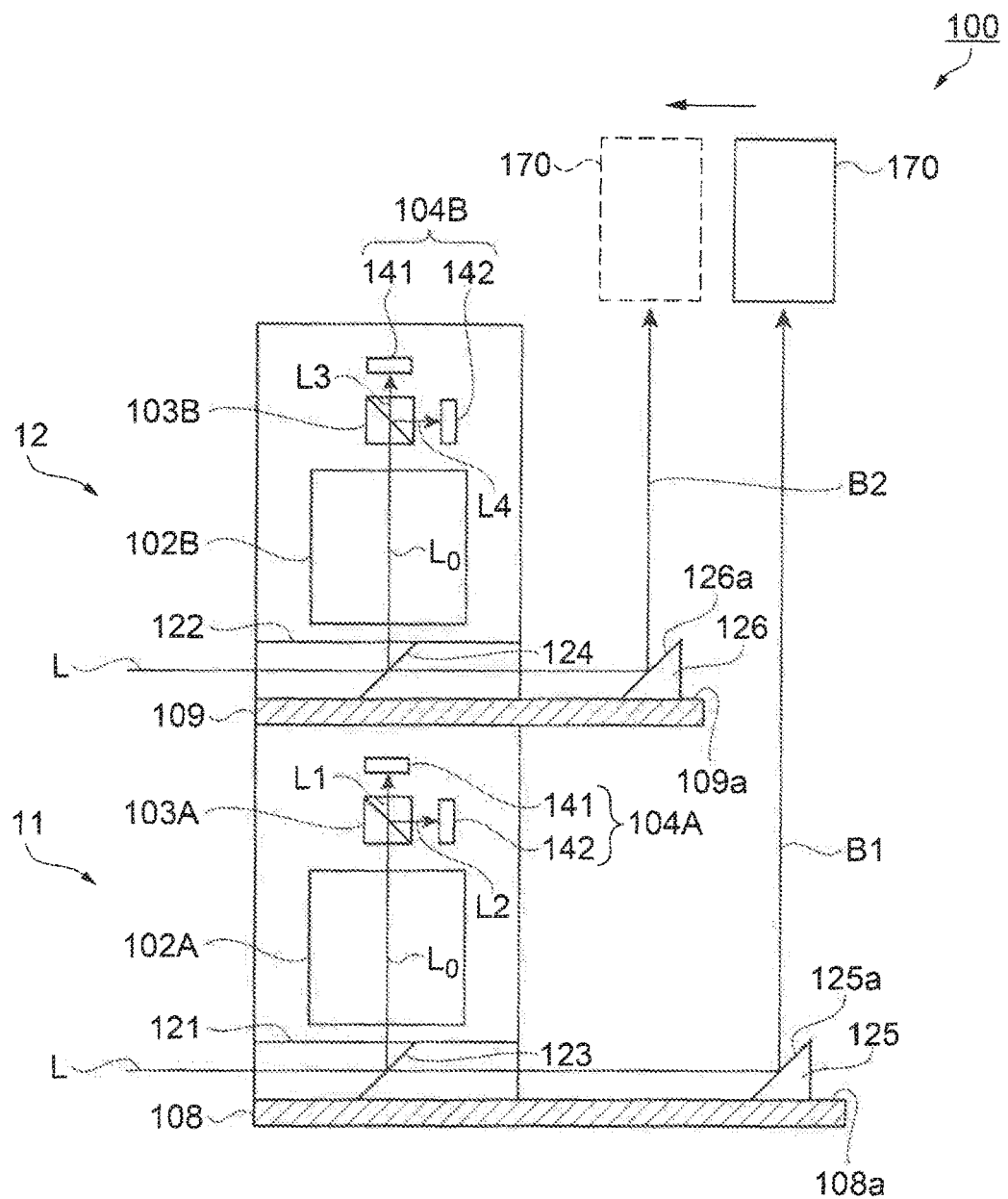
FIG. 5 is a schematic diagram illustrating a configuration of the magnetic field measuring device of the first embodiment.

FIG. 5 is a schematic diagram illustrating another configuration of the magnetic field measuring device of the first embodiment. Specifically, FIG. 5 is the schematic diagram illustrating the configuration of the magnetic field measuring device 100 when viewed in a Y-axial direction orthogonal to the Z-axial direction.

As illustrated in FIG. 5, the magnetic field measuring device 100 includes a first support 108 that supports the first cell 102A, the first polarization splitter 103A, and the light receiving elements 141 and 142 of the measuring magnetic sensor 11. Similarly, the magnetic field measuring device includes a second support 109 that supports the second cell 102B, the second polarization splitter 103B, and the light receiving elements 141 and 142 of the reference magnetic sensor 12. Although not illustrated in detail, each of the first support 108 and the second support 109 is a structure that can support the components in a three-dimensional manner. The first support 108 is provided with a surface in a bottom portion of the structure on the first cell 102A side, which is set as a first reference surface 108a. Similarly, the second support 109 is provided with a surface in a bottom portion of the structure on the second cell 102B side, which is set as a second reference surface 109a.

The embodiment employs a configuration, in which an area of the first reference surface 108a is larger than an area of the second reference surface 109a, a part of the first reference surface 108a projects from the second reference surface 109a in an X-axial direction in a plan view in the Z-axial direction when the second support 109 overlaps the first support 108 at a predetermined position.

A polarization beam splitter (PBS) 121 is provided between the first reference surface 108a of the first support 108 and the first cell 102A. The PBS 121 is provide with a dielectric mirror 123. The laser light L is incident to the PBS 121 in a direction parallel to the X-axial direction. The laser light L as the linearly polarized light incident to the dielectric mirror 123 of the PBS 121 branches into P polarized light having the polarization plane in the same direction as the direction of the polarization plane of the linearly polarized light and S polarized light having the polarization plane in a direction orthogonal to the direction of the polarization plane of the linearly polarized light. The P polarized light is transmitted through the dielectric mirror 123, and the S polarized light is reflected from the dielectric mirror 123 and is incident to the first cell 102A in the Z-axial direction.

The first reference surface 108a is provided with a reflective mirror 125 on a rear side from the dielectric mirror 123 in an incident direction of the laser light L to the PBS 121. The reflective mirror 125 is provided with a reflective surface 125a that is inclined at an angle of 45 degrees with respect to the first reference surface 108a and reflects the P polarized light transmitted through the dielectric mirror 123 in the Z-axial direction. In other words, the optical axis of the S polarized light reflected from the dielectric mirror 123 is parallel to the optical axis of the P polarized light reflected from the reflective mirror 125.

Similarly, a polarization beam splitter (PBS) 122 is provided between the second reference surface 109a of the second support 109 and the second cell 102B. The PBS 122 is provide with a dielectric mirror 124. The laser light L is incident to the PBS 122 in the direction parallel to the X-axial direction. The laser light L as the linearly polarized light incident to the dielectric mirror 124 of the PBS 122 branches into P polarized light having the polarization plane in the same direction as the direction of the polarization plane of the linearly polarized light and S polarized light having the polarization plane in a direction orthogonal to the direction of the polarization plane of the linearly polarized light. The P polarized light is transmitted through the dielectric mirror 124, and the S polarized light is reflected from the dielectric mirror 124 and is incident to the second cell 102B in the Z-axial direction.

The second reference surface 109a is provided with a reflective mirror 126 on a rear side from the dielectric mirror 124 in an incident direction of the laser light L to the PBS 122. The reflective mirror 126 is provided with a reflective surface 126a that is inclined at an angle of 45 degrees with respect to the second reference surface 109a and reflects the P polarized light transmitted through the dielectric mirror 124 in the Z-axial direction. In other words, the optical axis of the S polarized light reflected from the dielectric mirror 124 is parallel to the optical axis of the P polarized light reflected from the reflective mirror 126.

In the embodiment, the polarization beam splitter 121 disposed on the first reference surface 108a is an example of a first light branching unit according to the invention, and, similarly, the reflective mirror 125 disposed on the first reference surface 108a is an example of a first mirror according to the invention. In other words, a configuration of including the polarization beam splitter 121 and the reflective mirror 125 corresponds to a first light branching element according to the invention. In addition, the polarization beam splitter 122 disposed on the second reference surface 109a is an example of a second light branching unit according to the invention, and, similarly, the reflective mirror 126 disposed on the second reference surface 109a is an example of a second mirror according to the invention. In other words, a configuration of including the polarization beam splitter 122 and the reflective mirror 126 corresponds to a second light branching element according to the invention. The S polarized light, which is reflected from the polarization beam splitter 121 and is incident to the first cell 102A, corresponds to first polarized light, and the P polarized light, which is transmitted through the polarization beam splitter 121 and is reflected from the reflective mirror 125, corresponds to second polarized light. Similarly, the S polarized light, which is reflected from the polarization beam splitter 122 and is incident to the second cell 102B, corresponds to third polarized light, and the P polarized light, which is transmitted through the polarization beam splitter 122 and is reflected from the reflective mirror 126, corresponds to fourth polarized light. In the embodiment, as illustrated in FIG. 5, the laser light L (P polarized light) reflected from the reflective mirror 125 is referred to as beam light B1 because the laser light is a parallel light flux of beam light. Similarly, the laser light L (P polarized light) reflected from the reflective mirror 126 is referred to as beam light B2 because the laser light is also the parallel light flux of beam light.

Although not illustrated in FIG. 5, a heater for changing a temperature of the first cell 102A to a temperature suitable for the magnetic field measurement is provided between the polarization beam splitter 121 and the first cell 102A on the first reference surface 108a. For example, the heater is a plate-shaped ceramic heater and is disposed not to interfere with the laser light L incident to the first cell 102A. Similarly, a heater is provided between the polarization beam splitter 122 and the second cell 102B on the second reference surface 109a.

The magnetic field measuring device 100 includes an autocollimator 170 as an example of an optical axis detector. The autocollimator 170 is provided with a light receiving element such as a CCD that detects reflected light reflected from a front surface of a measurement target object. The autocollimator 170 is capable of detecting an orientation of an optical axis of the reflected light reflected from the front surface of the measurement target object. In the embodiment, the autocollimator 170 is provided in a state of being relatively movable at least in the X-axial direction with respect to the first support 108 and the second support 109 such that it is possible for the autocollimator to face, in the Z-axial direction, each of the reflective mirror 125 disposed on the first reference surface 108a and the reflective mirror 126 disposed on the second reference surface 109a.

As illustrated in FIG. 5, in the magnetic field measuring device 100 of the embodiment, the orientation of the optical axis of the beam light B1 reflected from the reflective mirror 125 and the orientation of the optical axis of the beam light B2 reflected from the reflective mirror 126 are detected by using the autocollimator 170. The magnetic field measuring device 100 includes a position adjusting mechanism that is capable of adjusting a position of the second cell 102B with respect to the first cell 102A, that is, a position of the second support 109 including the second reference surface 109a with respect to the first support 108 including the first reference surface 108a. The position adjusting mechanism enables the position of the second support 109 to be adjusted with respect to the first support 108, based on detection results from the autocollimator 170. The position adjusting mechanism may have a configuration in which the controller 107 can automatically adjust the position of the second support 109 with respect to the first support 108 with reference to the detection results from the autocollimator 170. Otherwise, the position adjusting mechanism may have a configuration in which the controller displays the detection results from the autocollimator 170 on the display unit 106, an operator checks the display, and it is possible to adjust the position of the second support 109 with respect to the first support 108.

In FIG. 5, the position adjusting mechanism is not illustrated in detail; however, if the mechanism is capable of adjusting the position of the second support 109 with respect to the first support 108 in the X-axial direction, the Y-axial direction, and the Z-axial direction, and is capable of adjusting tilts with respect to the axes of the X axis, the Y axis, and the Z axis, any mechanism may be employed. However, it is preferable that a material, which influences the magnetic field measurement, is not applied to the position adjusting mechanism.

A method for manufacturing the magnetic field measuring device 100 of the embodiment includes a position adjusting process of adjusting the position of the second cell 102B with respect to the first cell 102A, that is, adjusting the position of the second support 109 with respect to the first support 108. Hereinafter, the method for manufacturing the magnetic field measuring device 100 will be described.

Method for Manufacturing Magnetic Field Measuring Device

The method for manufacturing the magnetic field measuring device 100 of the embodiment includes a disposing process (Step S1) of disposing the first cell 102A and the second cell 102B in this order in the sensing direction of the magnetic field, an optical axis detecting process (Step S2) of detecting the orientation of the optical axis of the beam light B1 reflected from the reflective mirror 125 and the orientation of the optical axis of the beam light B2 reflected from the reflective mirror 126, and a position adjusting process (Step S3) of adjusting a position of the second support 109 with respect to the first support 108, based on the results of the optical axis detecting process. Hereinafter, description will be provided with reference to FIGS. 5 and 6.

Specifically, as illustrated in FIG. 5, the disposing process in Step S1 according to the embodiment is a process of disposing the second support 109 to which the reference magnetic sensor 12 is installed, such that the second support 109, overlaps, in the Z-axial direction, the first support 108, on which the measuring magnetic sensor 11 is installed. At this time, the second support 109 is temporarily locked at a predetermined position with respect to the first support 108. Then, the process proceeds to Step S2.

The optical axis detecting process in Step S2 includes a first process of detecting the orientation of the optical axis of the beam light B1 and a second process of detecting the orientation of the optical axis of the beam light B2.

Figure 6:
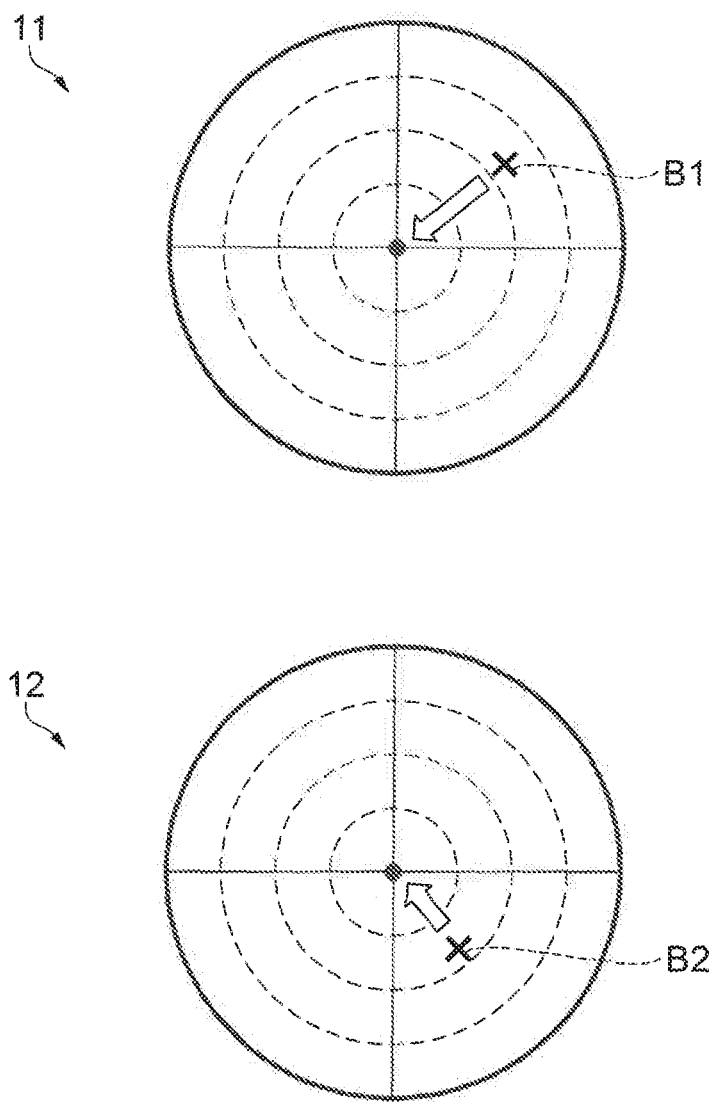
FIG. 6 is a diagram illustrating an example of a detection result of an orientation of an optical axis of beam light and an example of a detection result of an orientation of an optical axis of another beam light.

FIG. 6 is a diagram illustrating an example of a detection result of the orientation of the optical axis of the beam light B1 and an example of a detection result of the orientation of the optical axis of the beam light B2. Concentric circles illustrated in FIG. 6 are used to represent coordinates of the optical axes detected with the center of the concentric circles as a reference point. In this case, the reference point as the center of the concentric circles represents a coordinate of the optical axis of light incident to the autocollimator 170 in the Z-axial direction in the design of the magnetic field measuring device 100. In other words, the coordinate of the optical axis detected by the autocollimator 170 represent a direction and an angle of the optical axis as the orientation of the optical axis with respect to the reference point.

In the first process in Step S2, as illustrated in FIG. 5, the autocollimator 170 detects the orientation of the optical axis of the beam light B1 as the second polarized light reflected from the reflective mirror 125. In FIG. 6, mark "x" represents the orientation (coordinate) of the optical axis of the detected beam light B1. At this time, as illustrated in FIG. 6, in a case where the orientation (coordinate) of the optical axis of the beam light B1 significantly shifts from the reference point, the position of the measuring magnetic sensor 11 is adjusted on the first support 108 such that the orientation (coordinate) of the optical axis of the beam light B1 is coincident with the reference point. Specifically, relative positions of the polarization beam splitter 121, the first cell 102A, the first polarization splitter 103A, and the first light receiving unit 104A (light receiving elements 141 and 142) are adjusted with respect to the first reference surface 108a. As described above, until the adjustment on the first support 108 side is ended, the detection of the orientation (coordinate) of the optical axis of the beam light B1 is repeatedly performed. At the time when the adjustment on the first support 108 side is ended, the orientation (coordinate) of the optical axis of the beam light B1, which is obtained after the adjustment, is reset as the reference point in the autocollimator 170. It is not necessary for the orientation (coordinate) of the optical axis of the beam light B1 to be exactly coincident with the reference point, and a relative positional relationship therebetween within a predetermined range is considered that the orientation and the reference point are substantially coincident with each other.

In the second process in Step S2, as illustrated in FIG. 5, the autocollimator 170 is caused to relatively move in the X-axial direction, and the autocollimator 170, in which the orientation (coordinate) of the optical axis of the beam light B1 is reset as the reference point, detects the orientation (coordinate) of the optical axis of the beam light B2 reflected from the reflective mirror 126. In FIG. 6, mark "x" represents the orientation (coordinate) of the optical axis of the beam light B2. Then, the process proceeds to Step S3.

In the position adjusting process in Step S3, in a case where the orientation (coordinate) of the optical axis of the beam light B2 shifts from the reset reference point, in the second process in Step S2, as illustrated in FIG. 6, the position of the second support 109 is adjusted with respect to the first support 108 by using the position adjusting mechanism described above such that the orientation (coordinate) of the optical axis of the beam light B2 is coincident with the reference point. In other words, the position of the second support 109 is adjusted with respect to the first support 108 such that the orientation of the optical axis of the beam light B1 and the orientation of the optical axis of the beam light B2 are the same direction. As described above, until the adjustment on the second support 109 side is ended, the detection of the orientation (coordinate) of the optical axis of the beam light B2 is repeatedly performed.

The orientation of the optical axis of the beam light B1 and the orientation of the laser optical axis $L_O$ in the first cell 102A are basically the same direction. In addition, the orientation of the optical axis of the beam light B2 and the orientation of the laser optical axis $L_O$ in the second cell 102B are basically the same direction. Hence, in the position adjusting process, when the reference point is coincident with the orientation of the optical axis of the beam light B2 with the orientation of the optical axis of the beam light B1 as the reference (reference point), it is possible to cause the orientation of the laser optical axis $L_O$ in the first cell 102A to be coincident with the orientation of the laser optical axis $L_O$ in the second cell 102B.

In a case where a difference between the orientation of the laser optical axis $L_O$ in the first cell 102A and the orientation of the laser optical axis $L_O$ in the second cell 102B is obtained with accuracy of the angle of the optical axis, resolution of optical-axis-angle measurement in the autocollimator 170 needs to be obtained to be the same as the accuracy of the angle of the optical axis or to be lower than the accuracy of the angle of the optical axis.

According to the method for manufacturing the magnetic field measuring device 100 of the first embodiment, the following effects are achieved.

(1) The magnetic field measuring device 100 includes the first support 108 on which the measuring magnetic sensor 11 is installed, and the second support 109 on which the reference magnetic sensor 12 is installed. In addition, the autocollimator 170 is provided as the optical axis detector that can face the reflective mirror 125 provided on the first reference surface 108a of the first support 108 and the reflective mirror 126 provided on the second reference surface 109a of the second support 109, respectively, in the sensing direction (Z-axial direction). In addition, the position adjusting mechanism that is capable of adjusting the position of the second support 109 with respect to the first support 108 is provided. In the method for manufacturing the magnetic field measuring device 100, in the optical axis detecting process (Step S2), the autocollimator 170 detects the orientation of the optical axis of the beam light B1 as the second polarized light reflected from the reflective mirror 125 and the orientation of the optical axis of the beam light B2 as the fourth polarized light reflected from the reflective mirror 126. In the position adjusting process (Step S3), the position adjusting mechanism adjusts the position of the second support 109 with respect to the first support 108 such that the orientation of the optical axis of the beam light B1 is coincident with the orientation of the optical axis of the beam light B2, that is, the orientations (incident direction of the laser light L) of the laser optical axes $L_O$ in the first cell 102A and the second cell 102B are the same direction, based on the detection results from the autocollimator 170. Hence, since the noise of the external magnetic field EM is detected at the same level in the measuring magnetic sensor 11 and the reference magnetic sensor 12 disposed in the sensing direction, the signal processing unit 105 calculates a difference between an output from the first light receiving unit 104A and an output from the second light receiving unit 104B, and thereby it is possible to appropriately exclude influences (noise) of the external magnetic field EM. In other words, it is possible to provide a gradiometer-type magnetic field measuring device 100 that appropriately exclude the influence (noise) of the external magnetic field EM and is capable of measuring, by the measuring magnetic sensor 11, the magnetic field generated from the magnetic field source M1 with high accuracy, and the method for manufacturing the magnetic field measuring device 100.

(2) The optical axis detecting process (Step S2) includes the first process of detecting the orientation of the optical axis of the beam light B1 as the second polarized light reflected from the reflective mirror 125 and the second process of detecting the orientation of the optical axis of the beam light B2 as the fourth polarized light reflected from the reflective mirror 126. The second process is executed after the disposing process (Step S1) of disposing the first support 108, on which the measuring magnetic sensor 11 is installed, and the second support 109, on which the reference magnetic sensor 12 is installed, to overlap each other in the sensing direction, and the orientation of the optical axis of the beam light B2 is detected with the orientation of the optical axis of the beam light B1 detected in the first process, as a reference. Hence, in the position adjusting process, it is possible to easily adjust the position of the second support 109 with respect to the first support 108, that is, the position of the second cell 102B with respect to the first cell 102A, from the detection result in the second process. In other words, compared to a case where the disposing process is executed after the orientations of the laser optical axes $L_0$ in the two magnetic sensors 11 and 12 are individually adjusted, it is possible to easily adjust the orientations of the laser optical axes $L_0$ in the first cell 102A and the second cell 102B.

Next, the magnetic field measuring device of another embodiment is described in detail with reference to the figures.

Second Embodiment

Figure 7:
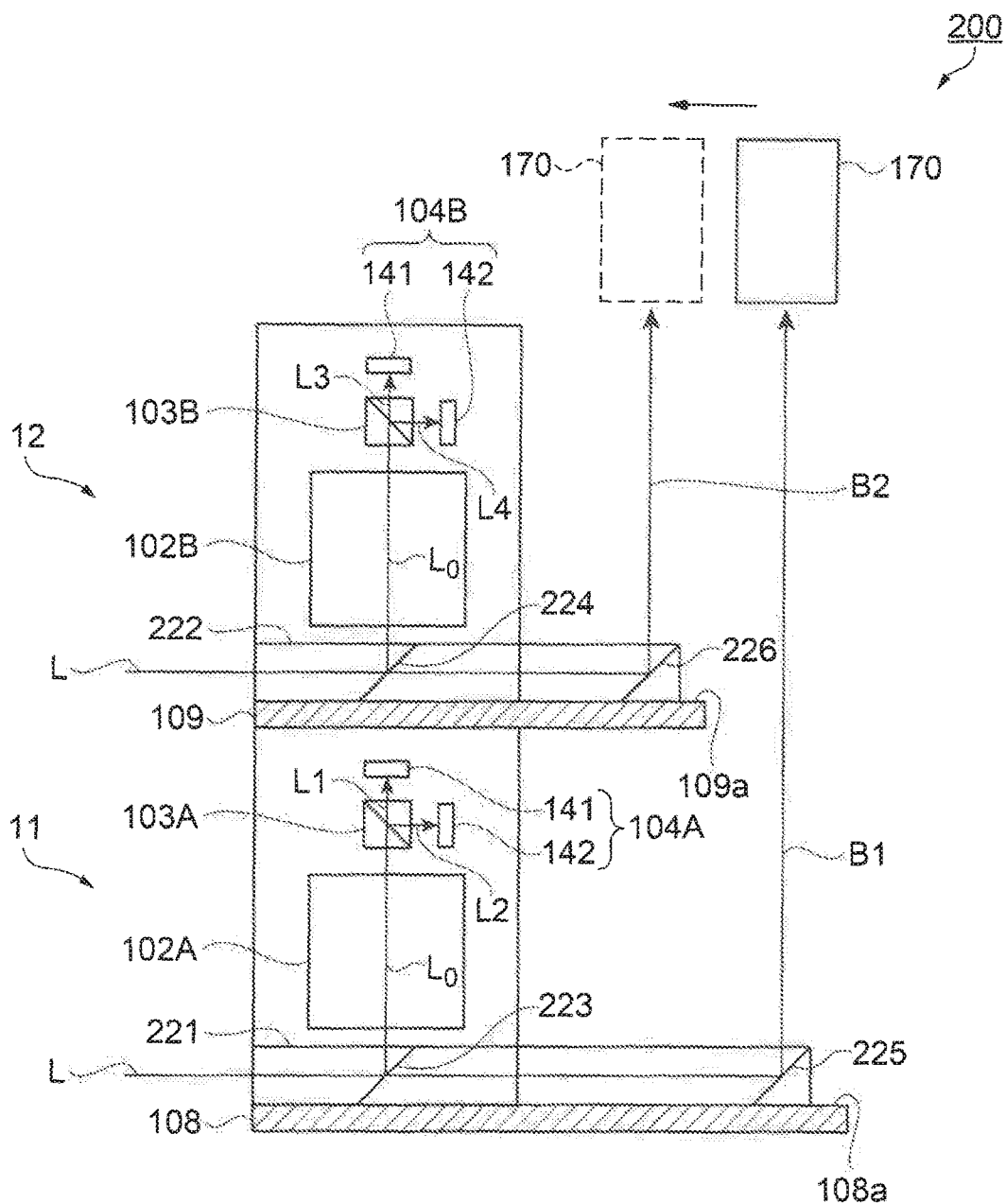
FIG. 7 is a schematic diagram illustrating a configuration of a magnetic field measuring device of a second embodiment.

FIG. 7 is a schematic diagram illustrating a configuration of a magnetic field measuring device of a second embodiment. Specifically, FIG. 7 corresponds to FIG. 5 in the first embodiment. In the magnetic field measuring device of the second embodiment, the same reference signs are assigned to the same configurations as those in the magnetic field measuring device 100 of the first embodiment, and thus detailed description thereof is omitted. In addition, the magnetic field measuring device of the second embodiment also has basically the gradiometer-type configuration illustrated in FIGS. 1 and 2 of the first embodiment.

As illustrated in FIG. 7, a magnetic field measuring device 200 of the embodiment includes the first support 108 on which the measuring magnetic sensor 11 is installed, and the second support 109 on which the reference magnetic sensor 12 is installed. The first support 108 and the second support 109 are disposed to overlap each other in the sensing direction (Z-axial direction). The surface of the first support 108 as the structure in the bottom portion on the first cell 102A side is set as the first reference surface 108a. Similarly, the surface of the second support 109 as the structure in a bottom portion on the second cell 102B side is set as the second reference surface 109a.

A non-polarization beam splitter (NPBS) 221 as the first light branching element that causes the laser light L emitted from the first light irradiator 101A to be incident in the Z-axial direction to the first cell 102A is disposed between the first reference surface 108a and the first cell 102A. The NPBS 221 includes a dielectric mirror 223 that transmits some of P polarized light components of the incident laser light L and reflects the rest of light such that the rest of light to be incident to the first cell 102A, and a dielectric mirror 225 that reflects, in the Z-axial direction, the P polarized light component transmitted through the dielectric mirror 223.

Similarly, a non-polarization beam splitter (NPBS) 222 as the second light branching element that causes the laser light L emitted from the second light irradiator 101B to be incident to the second cell 102B in the Z-axial direction is disposed between the second reference surface 109a and the second cell 102B. The NPBS 222 includes a dielectric mirror 224 that transmits some of P polarized light components of the incident laser light L and reflects the rest of light such that the rest of light to be incident to the second cell 102B, and a dielectric mirror 226 that reflects, in the Z-axial direction, the P polarized light transmitted through the dielectric mirror 224.

The NPBS 221 is provided over the substantially entire surface of the first reference surface 108a. Also, the NPBS 222 is provided over the substantially entire surface of the second reference surface 109a. An area of the NPBS 221 in the plan view in the Z-axial direction is larger than an area of the NPBS 222.

The autocollimator 170 is provided to face the dielectric mirror 225 of the NPBS 221 and the dielectric mirror 226 of the NPBS 222 in the sensing direction (Z-axial direction).

A method for manufacturing the magnetic field measuring device 200 of the embodiment is the same as the method for manufacturing the magnetic field measuring device 100 of the first embodiment described above; however, in the optical axis detecting process, the autocollimator 170 detects the orientation of the optical axis of the beam light B1 reflected from the dielectric mirror 225 of the NPBS 221 provided on the first reference surface 108a. Also, The autocollimator 170 detects the orientation of the optical axis of the beam light B2 reflected from the dielectric mirror 226 of the NPBS 222 provided on the second reference surface 109a.

According to the magnetic field measuring device 200 of the second embodiment and the method for manufacturing thereof, compared to the magnetic field measuring device 100 of the first embodiment described above, there is no need to provide the reflective mirrors 125 and 126, individually. The configuration of the device is simplified and thus it is possible to achieve the same effects as in the first embodiment.

Third Embodiment

Figure 8:
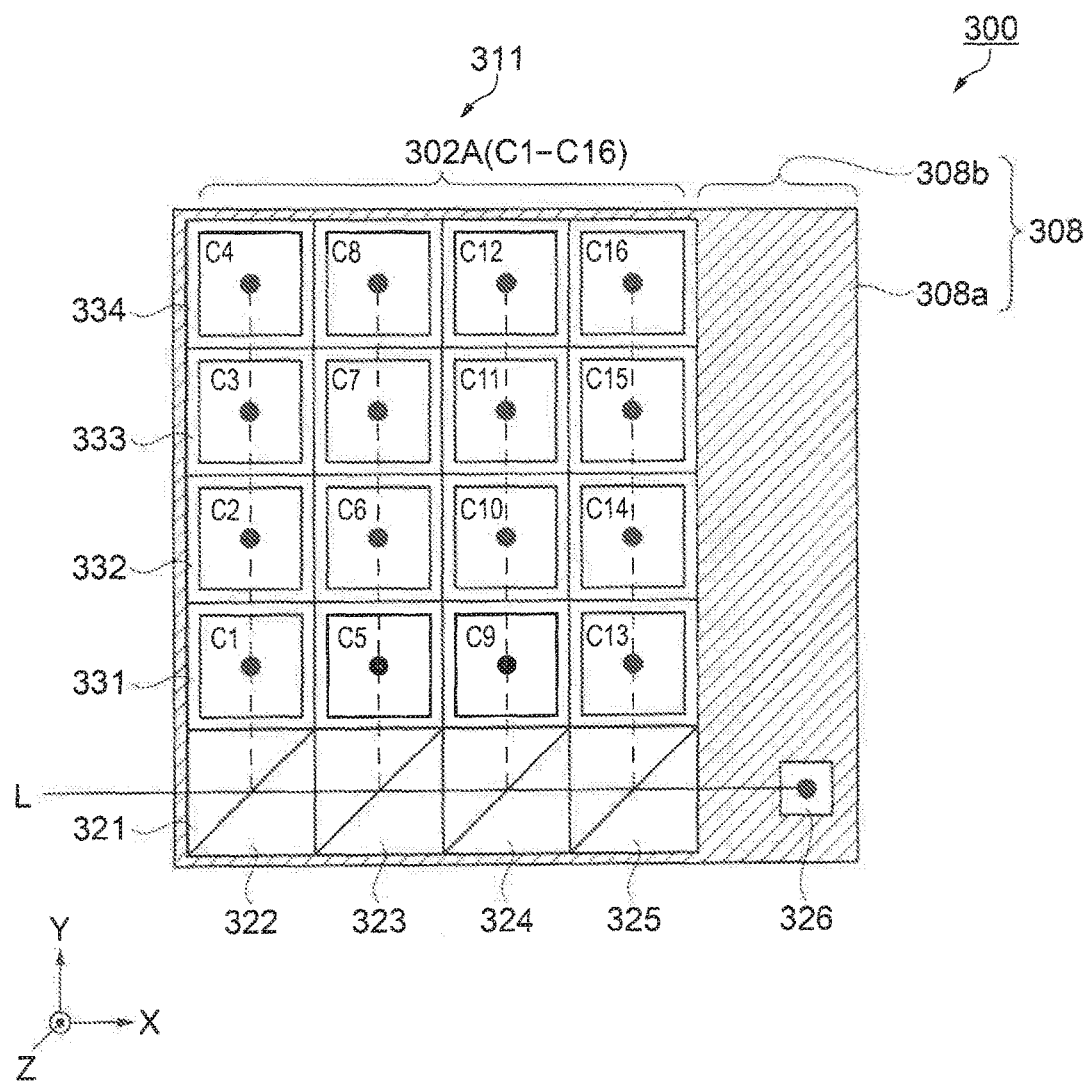
FIG. 8 is a plan view schematically illustrating disposition of cells in a magnetic field measuring device of a third embodiment.
Figure 9:
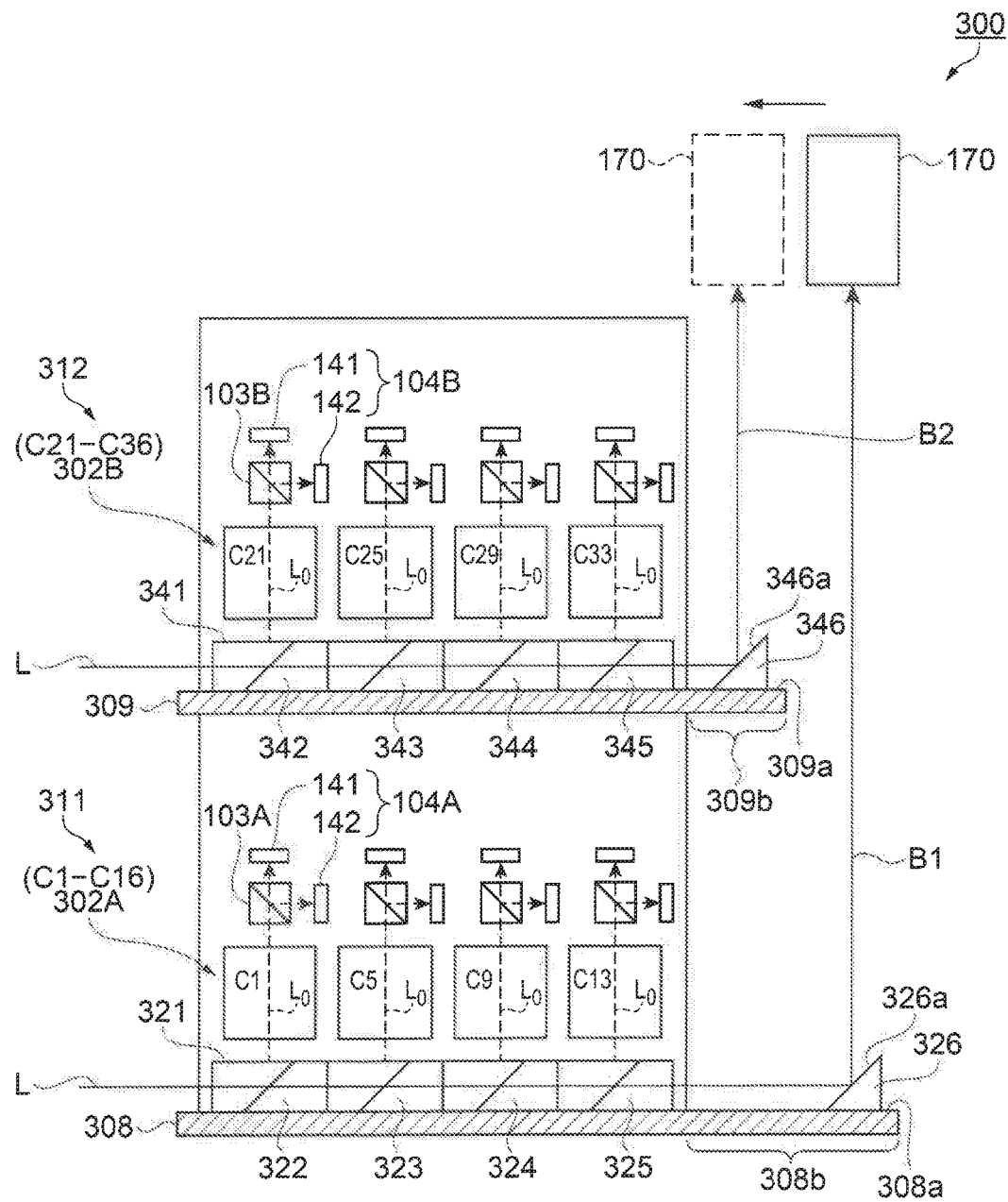
FIG. 9 is a schematic diagram illustrating a configuration of the magnetic field measuring device of the third embodiment.

FIG. 8 is a plan view schematically illustrating the disposition of the cells in a magnetic field measuring device of a third embodiment, and FIG. 9 is a schematic diagram illustrating the configuration of the magnetic field measuring device of the third embodiment. Specifically, FIG. 9 corresponds to FIG. 5 in the first embodiment. In the magnetic field measuring device of the third embodiment, the same reference signs are assigned to the same configurations as those in the magnetic field measuring device 100 of the first embodiment, and thus detailed description thereof is omitted. The magnetic field measuring device of the third embodiment also has basically the gradiometer-type configuration illustrated in FIGS. 1 and 2 of the first embodiment, and is a magnetic field measuring device that includes the measuring magnetic sensor and the reference magnetic sensor which are configured in multichannel manners, respectively.

FIG. 8 illustrates disposition of the cells in a magnetic field measuring device 300 of the embodiment and illustrates the disposition of the cells in the plan view in the sensing direction (Z-axial direction).

As illustrated in FIG. 8, the magnetic field measuring device 300 of the embodiment includes a measuring magnetic sensor 311. The measuring magnetic sensor 311 is configured as the multichannel sensor configured to include a cell array 302A formed to include a plurality of cells. The magnetic field measuring device 300 includes a first optical element 321 that causes the laser light L to be incident to the cells of the cell array 302A. In addition, the magnetic field measuring device 300 includes a first support 308 on which the measuring magnetic sensor 311 is installed.

The cell array 302A includes 16 cells from cell C1 to cell C16 arranged to have a matrix shape in the X-axial direction and the Y-axial direction. The number of cells is not limited thereto. In addition, in FIG. 8, the plurality of cells are arranged at intervals in the X-axial direction and the Y-axial direction; however, adjacent cells may be brought into close contact.

The first optical element 321 includes a plurality of non-polarization beam splitters (NPBS) that guide the laser light L to the cell groups with four cells disposed in the Y-axial direction of the cell array 302A as a unit. Specifically, the first optical element 321 includes four non-polarization beam splitters (NPBS) 322, 323, 324, and 325 disposed side by side in the X-axial direction, and four NPBSs 331, 332, 333, and 334 disposed side by side in the Y-axial direction, which correspond to the four NPBSs 322, 323, 324, and 325.

The four NPBSs 322, 323, 324, and 325 transmit some of the P polarized light components of the laser light L incident in the X-axial direction and reflect the rest thereof. Specifically, a proportion of a reflection rate R and transmittance T of the P polarized light components in the four NPBSs 322, 323, 324, and 325 is as follows in the following Table 1.

TABLE 1

| Non-polarization beam splitter (NPBS) | 322 | 323 | 324 | 325 |
|---|---|---|---|---|
| Reflection rate R: transmittance T (P polarized light component) | 24:76 | 32:68 | 46:54 | 95:5 |

The four NPBSs 331, 332, 333, and 334 cause the laser light L (P polarized light) incident in the Y-axial direction to be incident to the four cells arranged in the Y-axial direction, at the same intensity, respectively. Specifically, a proportion of a reflection rate R and transmittance T of the P polarized light components in the four NPBSs 331, 332, 333, and 334 is as follows in the following Table 2.

TABLE 2

| Non-polarization beam splitter (NPBS) | 331 | 332 | 333 | 334 |
|---|---|---|---|---|
| Reflection rate R: transmittance T (P polarized light component) | 25:75 | 33:67 | 50:50 | 100:0 |

The laser light L is incident to the NPBS 322 of the first optical element 321 in the X-axial direction. Some of the P polarized light components of the laser light L incident to the NPBS 322 are transmitted through the NPBS 322, and the P polarized light components reflected from the NPBS 322 are incident to the NPBS 331, 332, 333, and 334 and are guided to the cells C1 to C4 which are aligned in the Y-axial direction. The P polarized light guided to the cells C1 to C4 is incident to and is transmitted through the cells C1 to C4 in the Z-axial direction, respectively.

Some of the P polarized light components which are transmitted through the NPBS 322 and are incident to the NPBS 323 are transmitted through the NPBS 323, and the P polarized light components reflected from the NPBS 323 are incident to the NPBS 331, 332, 333, and 334 and are guided to the cells C5 to C8 which are aligned in the Y-axial direction. The P polarized light guided to the cells C5 to C8 is incident to and is transmitted through the cells C5 to C8 in the Z-axial direction, respectively.

Some of the P polarized light components which are transmitted through the NPBS 323 and are incident to the NPBS 324 are transmitted through the NPBS 324, and the P polarized light components reflected from the NPBS 324 are incident to the NPBS 331, 332, 333, and 334 and are guided to the cells C9 to C12 which are aligned in the Y-axial direction. The P polarized light guided to the cells C9 to C12 is incident to and is transmitted through the cells C9 to C12 in the Z-axial direction, respectively.

Some of the P polarized light components which are transmitted through the NPBS 324 and are incident to the NPBS 325 are transmitted through the NPBS 325, and the P polarized light components reflected from the NPBS 325 are incident to the NPBS 331, 332, 333, and 334 and are guided to the cells C13 to C16 which are aligned in the Y-axial direction. The P polarized light guided to the cells C13 to C16 is incident to and is transmitted through the cells C13 to C16 in the Z-axial direction, respectively.

A reflective mirror 326 is provided on the rear side from the NPBS 325 in the X-axial direction in which the laser light L is incident to the first optical element 321. The P polarized light components transmitted through the NPBS 325 are reflected from the reflective mirror 326 in the Z-axial direction. In the configuration of the embodiment, as shown in Table 1, 5% of the light incident to the NPBS 325 is reflected from the reflective mirror 326.

In FIG. 8, positions of optical axes of the laser light L (P polarized light) which is incident to and is transmitted through the cells C1 to C16 in the Z-axial direction are represented by "black dots". In addition, the positions of the optical axes of the laser light L (P polarized light) which is reflected from the reflective mirror 326 are also represented by the "black dots". A direction in which the laser light L is guided to the plurality of cells arranged in the matrix shape is not limited to the X-axial direction, and may be the Y-axial direction.

The first support 308 is provided with a portion that overlaps the first optical element 321 provided to correspond to the cells C1 to C16 in the plan view parallel to the Z-axial direction, and a projection portion 308b that projects from the portion in the X-axial direction. In the embodiment, the surface of the projection portion 308b on the cell side is set to the first reference surface 308a.

The magnetic field measuring device 300 of the embodiment includes the reference magnetic sensor corresponding to the measuring magnetic sensor 311, and the reference magnetic sensor also has the same multichannel-type configuration as the measuring magnetic sensor 311. Hereinafter, a configuration of the magnetic field measuring device 300 will be described with reference to FIG. 9.

As illustrated in FIG. 9, the magnetic field measuring device 300 includes the measuring magnetic sensor 311 and the reference magnetic sensor 312 which are disposed in the sensing direction (Z-axial direction). The measuring magnetic sensor 311 includes the cell array 302A provided with the cells C1 to C16, the first polarization splitter 103A provided for each cell, and the light receiving elements 141 and 142 (first light receiving unit 104A). The reference magnetic sensor 312 includes a cell array 302B provided with 16 cells from the cell C21 to the cell C36, the second polarization splitter 103B provided for each cell, and the light receiving elements 141 and 142 (second light receiving unit 104B).

In addition, the magnetic field measuring device 300 includes the first support 308 on which the measuring magnetic sensor 311 is installed, and the second support 309 on which the reference magnetic sensor 312 is installed. The first optical element 321, which causes the laser light L to be incident to the cells of the cell array 302A in the Z-axial direction, is provided between the bottom portion of the first support 308 as the structure and the cell array 302A.

A second optical element 341, which causes the laser light L to be incident to the cells of the cell array 302B in the Z-axial direction, is provided between the bottom portion of the second support 309 as the structure and the cell array 302B. A configuration of the second optical element 341 is also the same as that of the first optical element 321, and in order to guide the laser light L to the cells, the second optical element includes four non-polarization beam splitters (NPBSs) 342, 343, 344, and 345 arranged in the X-axial direction, and four non-polarization beam splitters (NPBSs) disposed side by side in the Y-axial direction. The proportion of the reflection rate R and transmittance T of the P polarized light components in the four non-polarization beam splitters (NPBSs) 342, 343, 344, and 345 is the same as the content of the NPBS 322, 323, 324, and 325 in Table 1 shown above.

The NPBSs described above in the second optical element 341 are set to have the reflection rate R and the transmittance T in the P polarized light components of the laser light L in the NPBSs such that the intensity of the laser light L transmitted through the cells C21 to C36 is substantially the same as that of the cells 21 to 36. Specifically, the proportion of the reflection rate R and the transmittance T of the P polarized light components in the four NPBSs is the same as the content of the NPBSs 331, 332, 333, and 334 shown in Table 2 above.

A reflective mirror 346 is disposed on the rear side from the NPBS 345 in the X-axial direction in which the laser light L is incident to the second optical element 341. The P polarized light transmitted through the NPBS 345 is reflected from the reflective mirror 346 in the Z-axial direction. In the configuration of the embodiment, as the same as the NPBS 325 shown in Table 1, 5% of the light incident to the NPBS 345 is reflected from the reflective mirror 346.

In a case where the measuring magnetic sensor 311 and the reference magnetic sensor 312 are the multichannel type, it is preferable that the first light irradiator 101A for the measuring magnetic sensor 311 and the second light irradiator 101B for the reference magnetic sensor 312 are provided rather than guiding the laser light L generated from one light irradiator 110 to two sets of cell arrays 302A and 302B. Compared to a case of using one light irradiator 110, the intensity of the laser light L emitted from the light source 111 is suppressed and the intensity of the laser light L transmitted through the cells is likely to be substantially the same.

For example, in the magnetic field measuring device 300 of the embodiment, if the cell C1 is set to a first cell according to the invention, the cell C2 corresponds to a third cell according to the invention. Similarly, if the cell C21 is set to a second cell according to the invention, the cell C22 corresponds to a fourth cell according to the invention. In addition, a configuration of including the first optical element 321 as the first light branching unit and the reflective mirror 326 as the first mirror corresponds to the first light branching element according to the invention, and a configuration of including the second optical element 341 as the second light branching unit and the reflective mirror 346 as the second mirror corresponds to the second light branching element according to the invention.

The first support 308 on which the measuring magnetic sensor 311, the first optical element 321, and the reflective mirror 326 are installed, overlaps in the sensing direction (Z-axial direction) the second support 309 on which the reference magnetic sensor 312, the second optical element 341, and the reflective mirror 346 are installed.

The second support 309 is provided with a projection portion 309b at a position at which the projection portion overlaps the projection portion 308b in the first support 308 in the plan view parallel to the Z-axial direction. The surface of the projection portion 308b on the cell array 302A is set as the first reference surface 308a, and the surface of the projection portion 309b on the cell array 302B is set as the second reference surface 309a. The reflective mirror 326 is disposed at an end portion of the projection portion 308b, and the reflective mirror 346 is disposed at an end portion of the projection portion 309b, in the X-axial direction.

Although not illustrated in FIG. 9, a heater for changing a temperature for each cell of the cell array 302A to a temperature suitable for the magnetic field measurement is provided between the first optical element 321 on the first reference surface 308a and the cell array 302A. For example, the heater is a plate-shaped ceramic heater and is disposed not to interfere with the laser light L incident to the cells of the cell array 302A. Similarly, a heater is provided between the second optical element 341 on the second reference surface 309a and the cell array 302B.

The autocollimator 170 is provided to face the reflective mirror 326 provided on the first reference surface 308a and the reflective mirror 346 provided on the second reference surface 309a, respectively, in the sensing direction (Z-axial direction). The autocollimator 170 is capable of detecting the orientation of the optical axis of the beam light B1 as the second polarized light reflected from the reflective surface 326a of the reflective mirror 326. Similarly, the autocollimator 170 is caused to relatively move in the X-axial direction with respect to the first support 308 and the second support 309, and thereby the autocollimator 170 is capable of detecting the orientation of the optical axis of the beam light B2 as the fourth polarized light reflected from the reflective surface 346a of the reflective mirror 346.

In addition, the magnetic field measuring device 300 includes the position adjusting mechanism that is capable of adjusting the position of the second support 309 with respect to the first support 308. In the magnetic field measuring device 300, the position adjusting mechanism adjusts the position of the second support 309 with respect to the first support 308, that is, the position of the cell array 302B with respect to the cell array 302A, such that the orientation of the optical axis of the beam light B1 and the orientation of the optical axis of the beam light B2 which are detected by the autocollimator 170, are coincident with each other.

A method for manufacturing the magnetic field measuring device 300 is basically the same as the method for manufacturing the magnetic field measuring device 100 of the first embodiment, and includes a disposing process of disposing the first support 308, on which the cell array 302A is installed, and the second support 309, on which the cell array 302B is installed, in this order in the sensing direction of the magnetic field, an optical axis detecting process of detecting the orientation of the optical axis of the beam light B1 as the second polarized light and the orientation of the optical axis of the beam light B2 as the fourth polarized light, and a position adjusting process of adjusting the position of the second support 309 with respect to the first support 308 such that the orientation of the optical axis of the beam light B1 and the orientation of the optical axis of the beam light B2 are the same direction, based on the result of the optical axis detecting process.

In the optical axis detecting process includes the first process of detecting the orientation of the optical axis of the beam light B1 reflected from the reflective mirror 326 and the second process of detecting the orientation of the optical axis of the beam light B2 reflected from the reflective mirror 346. The second process is executed after the disposing process, and the orientation of the optical axis of the beam light B2 is detected with the orientation of the optical axis of the beam light B1 detected in the first process as a reference.

According to the magnetic field measuring device 300 of the third embodiment and the method for manufacturing thereof, the laser light L as the linearly polarized light is incident to the cells disposed in the gradiometer type and the multichannel type in the same direction. In other words, it is possible to provide a gradiometer-type and multichannel-type magnetic field measuring device 300 that appropriately excludes the influence (noise) of the external magnetic field EM, with the orientations of the laser optical axes $L_O$ in the cells in the same direction, and is capable of measuring, by the measuring magnetic sensor 311, the magnetic field generated from the magnetic field source M1 with high accuracy, and the method for manufacturing the magnetic field measuring device. Since the magnetic field measuring device 300 is the multichannel type, it is possible to measure the magnetic field generated from the magnetic field source M1 over a broad range, compared to the magnetic field measuring device 100 of the first embodiment and the magnetic field measuring device 200 of the second embodiment.

In addition, in the position adjusting process, it is possible to easily adjust the position of the second support 309 with respect to the first support 308, from the detection result in the second process. In other words, compared to a case where the disposing process is executed after the orientations of the laser optical axes $L_O$ in the two magnetic sensors 311 and 312 are individually adjusted, it is possible to easily adjust the orientations of the laser optical axes $L_O$ in the cell array 302A and the cell array 302B. In other words, in the multichannel type, it is also possible to easily adjust the orientation of the laser optical axis $L_O$ of the laser light L functioning as the probe light.

The invention is not limited to the embodiments described above, can be appropriately modified within a range in which the modification is not contrary to the gist or the ideas of the invention read in the appended claims and the specification, and a magnetism measuring device and a method for manufacturing the magnetism measuring device achieved depending on such modification are also included in the scope of the invention. Various modification examples other than the embodiments are considered. Hereinafter, modification examples will be described.

Modification Example 1

Figure 10:
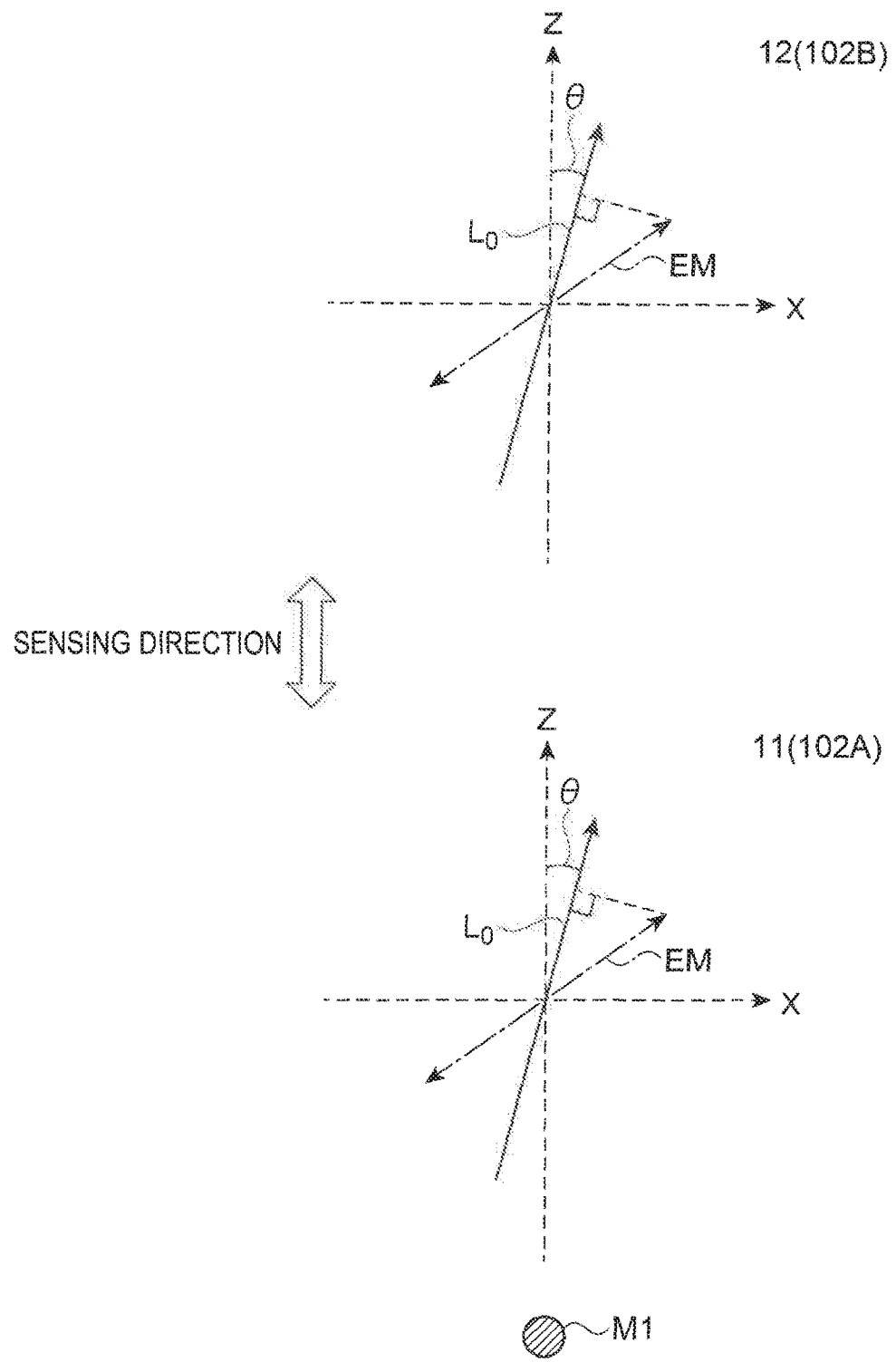
FIG. 10 is a schematic diagram illustrating a relationship between an orientation of a laser optical axis and an external magnetic field according to a modification example.
Figure 11:
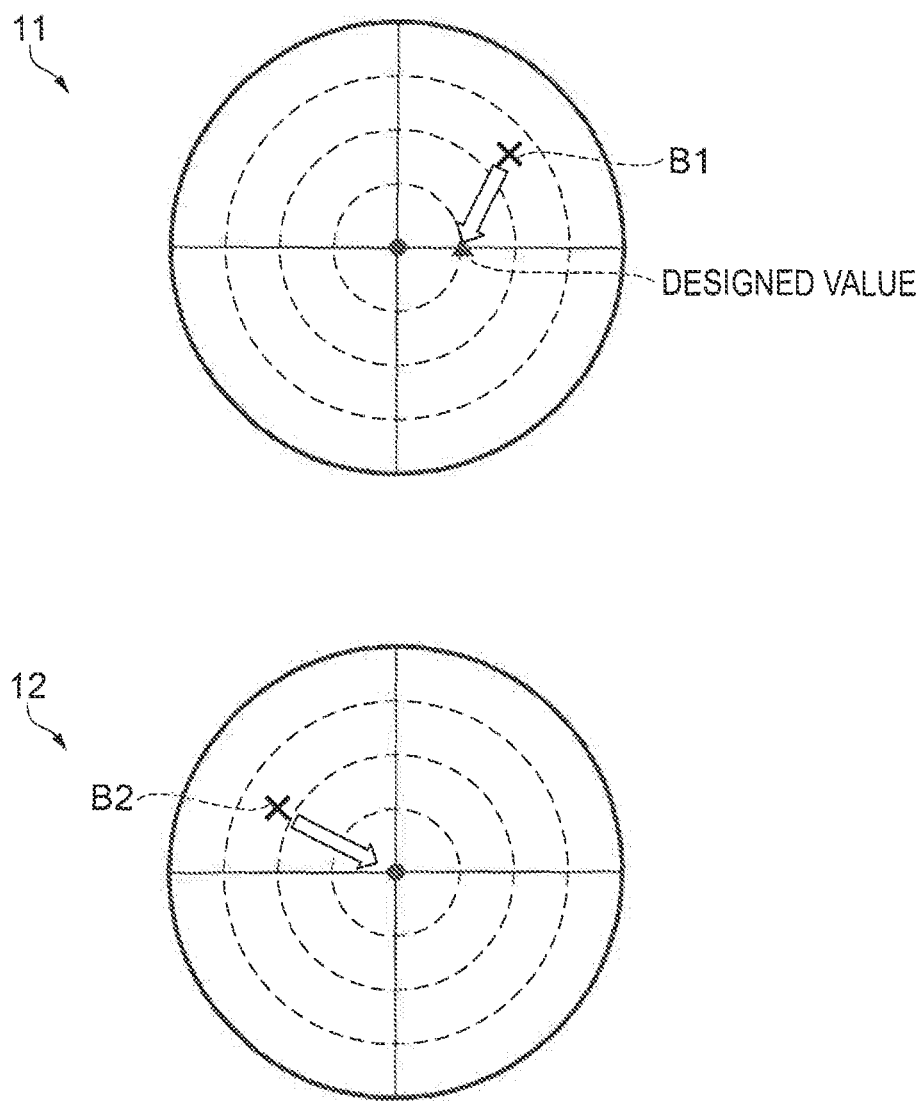
FIG. 11 is a schematic diagram illustrating a method for adjusting the orientation of the laser optical axis according to the modification example.

The orientation of the laser optical axis $L_O$ of the laser light L functioning as the probe light may not be necessarily coincident with the sensing direction. FIG. 10 is a schematic diagram illustrating a relationship between an orientation of a laser optical axis and an external magnetic field according to a modification example. FIG. 11 is a schematic diagram illustrating a method for adjusting the orientation of the laser optical axis according to the modification example. Specifically, FIGS. 10 and 11 are based on the magnetic field measuring device 100 and the method for manufacturing the magnetic field measuring device of the first embodiment.

As illustrated in FIG. 10, the laser optical axes $L_O$ of the cells 102A and 102B of the two magnetic sensors 11 and 12 according to the modification example intersect with each other at an angle θ with respect to the sensing direction (Z-axial direction). As described above, the sensing direction (Z-axial direction) and the orientations of the laser optical axes $L_O$ may not be coincident with each other, as long as the orientations of the laser optical axes $L_O$ in the cells 102A and 102B of the two magnetic sensors 11 and 12 are coincident with each other. In this manner, since noises of the external magnetic fields EM detected by the two magnetic sensors 11 and 12 have the same level, it is possible to measure the magnitude of the magnetic field of the magnetic field source M1 by the measuring magnetic sensor 11 with high accuracy as long as the signal processing unit 105 operates a difference between outputs from the two magnetic sensors 11 and 12.

The sensing direction (Z-axial direction) and the orientation of the laser optical axis $L_O$ may not be coincident with each other. Therefore, it is possible to provide a highly sensitive magnetic field measuring device that has high flexibility in the position of the magnetic field source M1 disposed with respect to the cells, has high flexibility in the position of the light irradiator that performs irradiation with the laser light L, and is reduced in size.

In a method for manufacturing the magnetic field measuring device of the modification example, as illustrated in FIG. 11, in the first process in an optical axis detecting process, the orientation (coordinate) of the optical axis of the beam light B1 reflected from the reflective mirror 125 is detected. The position of the measuring magnetic sensor 11 is adjusted with respect to the first reference surface 108a such that a designed value (for example, a coordinate represented by a triangle in FIG. 11) corresponding to the angle θ separated from the reference point is coincident with the orientation (coordinate) of the optical axis of the beam light B1 represented by "x". Subsequently, the second process is executed after the disposing process, and the orientation of the optical axis of the beam light B2 reflected from the reflective mirror 126 is detected with the orientation of the optical axis of the beam light B1 set to the designed value, as a reference (reference point). The position adjusting process is performed to adjust the position of the second support 109 with respect to the first support 108, based on detection results in the second process. According to this method, it is possible to set the orientation of the laser optical axis $L_O$ to a direction intersecting with the sensing direction (Z-axial direction) at the angle θ in the first cell 102A and the second cell 102B.

Modification Example 2

In the magnetic field measuring device of the embodiments, the autocollimator 170 is not a essential component. In other words, in the optical axis detecting process in the method for manufacturing the magnetic field measuring device, the orientation of the optical axis of the beam light B1 and the orientation of the optical axis of the beam light B2 may be detected by using the autocollimator 170. After the position adjusting process is ended, the autocollimator 170 may be detached from the magnetic field measuring device. In a configuration in which the autocollimator 170 is mounted all the time, it is possible to appropriately monitor whether the orientations of the laser optical axes $L_O$ in the first cell and the second cell are the same direction.

Modification Example 3

In the magnetic field measuring device of the embodiments, there is no limitation to the configuration in which the autocollimator 170 is caused to relatively move in the X-axial direction to the position at which it is possible to receive the beam light B1 and the beam light B2. For example, the beam light B1 and the beam light B2 may be simultaneously received by using the autocollimator 170 including a light receiving element having a large light receiving area. In this manner, it is possible not to use a mechanism that causes the autocollimator 170 to relatively move. In addition, in this case, when the beam light B1 and the beam light B2 may be simultaneously received, it is preferable that a light blocking unit that blocks one beam light is provided when the other beam light is incident to the autocollimator 170 such that the beam light B1 and the beam light B2 do not interfere with each other. As the light blocking unit, it is possible to use a shutter or the like that can block independently each of the beam light B1 and the beam light B2.

Modification Example 4

In the magnetic field measuring device 300 of the third embodiment, the configuration of the first light branching element is not limited to the configuration in which the first optical element 321 and the reflective mirror 326 are combined, and the non-polarization beam splitter 221 including the dielectric mirror 226 that reflects the incident laser light L as the beam light B1 may be applied as in the second embodiment. The same is true of the second light branching element.

Modification Example 5

In the magnetic field measuring device 300 of the third embodiment, the laser light L incident to the first optical element 321 may have the P polarized light component and the S polarized light component. In this case, a configuration in which the laser light L is incident to the first optical element 321 as the polarization beam splitter (PBS), is split into the P polarized light component and the S polarized light component, and any component is guided to the cells C1 to C16 may be employed. The same is true of the second optical element 341.

The entire disclosure of Japanese Patent Application No. 2016-122368 filed Jun. 21, 2016 is expressly incorporated by reference herein.

What is claimed is:

1. A magnetic field measuring device comprising:
    a light irradiator that performs irradiation with linearly polarized light;
    a first cell and a second cell in which alkali metal atoms are entrapped and which are disposed in this order in a sensing direction of a magnetic field;
    a first light branching element that causes the linearly polarized light to branch into first polarized light which is incident to the first cell and second polarized light which is parallel to the first polarized light; and
    a second light branching element that causes the linearly polarized light to branch into third polarized light which is incident to the second cell and fourth polarized light which is parallel to the third polarized light,
    wherein a position of the second cell is adjusted with respect to the first cell such that an orientation of an optical axis of the second polarized light and an orientation of an optical axis of the fourth polarized light are the same direction.

2. The magnetic field measuring device according to claim 1,
    wherein the first light branching element is provided with a first light branching unit that reflects the linearly polarized light, causes the light to be incident to the first cell, and converts the light into the first polarized light, and a first mirror that reflects the linearly polarized light transmitted through the first light branching unit and converts the light into the second polarized light, and
    wherein the second light branching element is provided with a second light branching unit that reflects the linearly polarized light, causes the light to be incident to the second cell, and converts the light into the third polarized light, and a second mirror that reflects the linearly polarized light transmitted through the second light branching unit and converts the light into the fourth polarized light.

3. The magnetic field measuring device according to claim 1, further comprising:
    an optical axis detector that is capable of detecting the orientation of the optical axis of the second polarized light and the orientation of the optical axis of the fourth polarized light.

4. The magnetic field measuring device according to claim 1, further comprising:
    a third cell disposed in a direction orthogonal to the sensing direction with respect to the first cell; and
    a fourth cell disposed in a direction orthogonal to the sensing direction with respect to the second cell.

5. The magnetic field measuring device according to claim 4,
    wherein the light irradiator is provided with a first light irradiator that irradiates the first cell and the third cell with the linearly polarized light and a second light irradiator that irradiates the second cell and the fourth cell with the linearly polarized light.

6. The magnetic field measuring device according to claim 1, further comprising:
    a first reference surface on which the first light branching element is disposed; and
    a second reference surface on which the second light branching element is disposed,
    wherein a position of the second reference surface is adjustable with respect to the first reference surface.

7. The magnetic field measuring device according to claim 1,
    wherein the sensing direction of the magnetic field intersects with an incident direction of the linearly polarized light in the first cell and the second cell.

8. A method for manufacturing a magnetic field measuring device that includes
    a light irradiator that performs irradiation with linearly polarized light,
    a first cell and a second cell in which alkali metal atoms are entrapped,
    a first light branching element that causes the linearly polarized light to branch into first polarized light which is incident to the first cell and second polarized light which is parallel to the first polarized light, and
    a second light branching element that causes the linearly polarized light to branch into third polarized light which is incident to the second cell and fourth polarized light which is parallel to the third polarized light,
    the method comprising:
    disposing the first cell and the second cell in this order in a sensing direction of a magnetic field;
    detecting an orientation of an optical axis of the second polarized light and an orientation of an optical axis of the fourth polarized light; and adjusting a position of the second cell with respect to the first cell such that the orientation of the optical axis of the second polarized light and the orientation of the optical axis of the fourth polarized light are the same direction, based on the result of the detecting of the optical axis.

9. The method for manufacturing a magnetic field measuring device according to claim 8, wherein the detecting of the optical axis includes, detecting the orientation of the optical axis of the second polarized light, and detecting the orientation of the optical axis of the fourth polarized light, and wherein the detecting the orientation of the optical axis of the fourth polarized light is performed after the disposing the first and second cells, and the orientation of the optical axis of the fourth polarized light is detected with the detected orientation of the optical axis of the second polarized light as a reference.

* * * * *